(12) United States Patent
Lesso

(10) Patent No.: US 11,317,227 B2
(45) Date of Patent: Apr. 26, 2022

(54) MONITORING CIRCUITRY

(71) Applicant: Cirrus Logic International Semiconductor Ltd., Edinburgh (GB)

(72) Inventor: John P. Lesso, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 17/038,660

(22) Filed: Sep. 30, 2020

(65) Prior Publication Data

US 2022/0103957 A1 Mar. 31, 2022

(51) Int. Cl.
*H04R 29/00* (2006.01)
*H03F 3/45* (2006.01)
*H04R 3/02* (2006.01)

(52) U.S. Cl.
CPC ....... *H04R 29/001* (2013.01); *H03F 3/45273* (2013.01); *H04R 3/02* (2013.01); *H03F 2200/03* (2013.01)

(58) Field of Classification Search
CPC ...................................................... H04R 29/00
See application file for complete search history.

(56) References Cited

U.S. PATENT DOCUMENTS 10,149,051 B2 * 12/2018 Thyssen .............. G10L 21/0232
2011/0228945 A1 * 9/2011 Mihelich .............. H04R 29/001
381/59
2016/0255448 A1 9/2016 Morant et al.

OTHER PUBLICATIONS

International Search Report and Written Opinion of the International Searching Authority, International Application No. PCT/GB2021/052500, dated Jan. 3, 2022.

* cited by examiner

*Primary Examiner* — Olisa Anwah
(74) *Attorney, Agent, or Firm* — Jackson Walker L.L.P.

(57) ABSTRACT

Monitoring circuitry, comprising: a current monitoring unit operable to monitor a speaker current flowing through a speaker and generate a monitor signal indicative of that current; and a controller operable, based on a control signal, to control the current monitoring unit to control whether the monitor signal is generated and/or a property of the monitor signal.

18 Claims, 10 Drawing Sheets

MONITORING CIRCUITRY

FIELD OF DISCLOSURE

The present disclosure relates in general to monitoring circuitry, in particular for use in a host device. More particularly, the disclosure relates to the use of a speaker as a sensor which may be referred to as a microphone. Such monitoring circuitry may be referred to as audio circuitry.

BACKGROUND

Monitoring circuitry may be implemented (at least partly on ICs) within a host device, which may be considered an electrical or electronic device and may be a mobile device. Examples devices include a portable and/or battery powered host device such as a mobile telephone, an audio player, a video player, a PDA, a mobile computing platform such as a laptop computer or tablet and/or a games device.

Battery life in host devices is often a key design constraint. As one way to address this, host devices may be capable of being placed in a lower-power state or "sleep mode." In this low-power state, generally only minimal circuitry is active, such minimal circuitry including components necessary to sense a stimulus for activating higher-power modes of operation. In some cases, one of the components remaining active is a capacitive microphone, in order to sense for e.g. voice activation commands for activating a higher-power state.

It is known to use a speaker (e.g. a loudspeaker) as a sensor, such a sensor being typically referred to as a microphone, and to monitor the speaker to pick up information sensed from its surroundings (e.g. based on sound incident on the speaker). Using a speaker as a microphone enables a reduction in the number of components provided in a host device or the number of them kept active in the low-power state. Reference in this respect may be made to U.S. Pat. No. 9,008,344, which relates to systems for using a speaker as a microphone in a mobile device.

However, such systems are considered to be open to improvement when performance (including signal and power performance) is taken into account.

It is desirable to provide improved monitoring circuitry, in which performance reaches acceptable levels. It is desirable to provide improved audio circuitry to enable a speaker (e.g. a loudspeaker) to be used both as a speaker and a microphone (e.g. simultaneously), with improved performance.

SUMMARY

According to a first aspect of the present disclosure, there is provided monitoring circuitry, comprising: a current monitoring unit operable to monitor a speaker current flowing through a speaker and generate a monitor signal indicative of that current; and a controller operable, based on a control signal, to control the current monitoring unit to control whether the monitor signal is generated and/or a property of the monitor signal.

It as advantageous to be able to control the power consumption in particular of the current monitoring unit, and/or properties of the monitor signal in this way, for example to configure the monitoring circuitry efficiently for a particular use case.

The controller may be operable, based on the control signal, to control operation of the current monitoring unit; and/or in which mode of operation of a plurality of modes of operation the current monitoring unit operates; and/or an operational parameter which defines operation of the current monitoring unit.

The plurality of modes of operation may include: an inactive mode of operation in which the current monitoring unit is inactive and the monitor signal is substantially not generated; and/or at least one active mode of operation in which the current monitoring unit is active and the monitor signal is generated.

The controller may be operable to generate the control signal based on the monitor signal and/or another signal such as a mode-selection signal. Such a signal may be received from an external signal provider or generated internally.

The controller may be operable to determine, analyse or extract information represented by the monitor signal, and to generate the control signal based on that information.

The controller may be operable to: determine a property of the monitor signal; compare the determined property to a target property; and generate said control signal to cause the determined property to tend towards the target property. Effectively, negative feedback control may be performed.

The property may comprise at least one of a frequency bandwidth, an SNR, a dynamic range, a resolution and a gain error. Other signal quality or accuracy properties may be controlled.

The current monitoring unit may comprise a current mirror operable to generate a mirror current which mirrors said speaker current, a magnitude of the mirror current dependent on a magnitude of the speaker current due to current mirroring. The monitor signal may be, or be generated from, the mirror current. The controller may be operable, based on the control signal, to control the current mirror and/or generation of the monitor signal from the mirror current to control whether the monitor signal is generated and/or a property of the monitor signal.

The controller may be configured, based on the control signal, to control the current mirror to control at least one of: whether the current mirror is active, such that the mirror current is generated, or inactive, such that the mirror current is substantially not generated or generated as a low-power current in comparison to the mirror current; a frequency bandwidth of the mirror current; a current-mirror gain error, being an error in the gain between the speaker current and the mirror current, optionally wherein the gain error comprises a DC offset in the gain; and an SNR or dynamic range of the mirror current.

The current mirror may comprise: a first transistor connected to carry the speaker current; a second transistor connected to carry the mirror current; and a differential amplifier configured to control, based on a feedback potential difference applied between inputs of the differential amplifier being a difference between a first drain-source voltage of the first transistor and a second drain-source voltage of the second transistor, a feedback component connected in series with the second transistor along a current path carrying the mirror current to cause the second drain-source voltage to track and/or substantially tend to equal the first drain-source voltage.

The controller may be configured, based on the control signal, to control whether the monitor signal is generated and/or a property of the monitor signal by controlling the differential amplifier and/or the second transistor.

The controller may be configured, based on the control signal, to control at least one of: a power supply to the differential amplifier; a gate signal of the second transistor; a control signal applied to the feedback component; whether a polarity of the feedback potential difference applied between the inputs of the differential amplifier is alternated; a rate at which the polarity is alternated; a bias level of an output-stage current of the differential amplifier; and a bias level of an input-stage current of the differential amplifier.

The controller may be configured, based on the control signal, to control: whether the current mirror is active or inactive by controlling at least one of a power supply to the differential amplifier, a gate signal of the second transistor and a control signal applied to the feedback component; and/or the current-mirror gain error by controlling whether a polarity of the feedback potential difference applied between the inputs of the differential amplifier is alternated and/or a rate at which the polarity is alternated; and/or the frequency bandwidth of the mirror current by controlling a bias level of an output-stage current of the differential amplifier; and/or the SNR or dynamic range of the mirror current by controlling a bias level of an input-stage current of the differential amplifier.

The current monitoring unit may comprise an impedance connected such that said mirror current flows through the impedance. The monitor signal may be generated based on a voltage across the impedance, optionally wherein the impedance is a resistor.

The current monitoring unit may comprise a filter operable to filter the mirror current or monitor signal. The controller may be configured, based on the control signal, to configure the filter to control the monitor signal or a signal generated from the monitor signal.

The current monitoring unit may comprise a generator operable to generate the monitor signal based on the speaker current or the mirror current. The controller may be configured, based on the control signal, to control the generator to control whether the monitor signal is generated and/or a property of the monitor signal.

The controller may be configured, based on the control signal, to control the generator to control at least one of: a frequency bandwidth of the monitor signal; an SNR or dynamic range of the monitor signal; and a resolution of the monitor signal.

The generator may comprise an analogue-to-digital converter configured to generate the monitor signal as a digital signal from the speaker current or the mirror current by analogue-to-digital conversion.

The controller may be configured, based on the control signal, to control: a clock rate or sample rate of the analogue-to-digital converter; and/or a bias current of the analogue-to-digital converter; the resolution of the ADC; and/or the order of the ADC.

The controller may be configured, based on the control signal, to control: the frequency bandwidth of the monitor signal by controlling a clock rate or sample rate of the analogue-to-digital converter; and/or the SNR or dynamic range of the monitor signal by controlling a bias current of the analogue-to-digital converter; the resolution of the monitor signal by controlling the resolution of the ADC; and/or the order of the ADC.

The monitoring may comprise a microphone signal generator operable, when external sound is incident on the speaker, to generate a microphone signal representative of the external sound based on the monitor signal. The monitoring may comprise a speaker driver operable to drive the speaker based on a speaker signal. The microphone signal generator may be operable to generate the microphone signal based on the monitor signal and the speaker signal.

The speaker signal may be indicative of or related to or proportional to a voltage signal applied to the speaker. The monitor signal may be related to or proportional to the speaker current flowing through the speaker.

The speaker driver may be operable to control the voltage signal applied to the speaker so as to maintain or tend to maintain or force a given relationship between the speaker signal and the voltage signal.

The microphone signal generator may comprise a converter configured to convert the monitor signal into the microphone signal based on the speaker signal, the converter defined at least in part by a transfer function modelling at least the speaker. The transfer function may model at least one of the speaker driver and the current monitoring unit, or both of the speaker driver and the current monitoring unit.

The monitoring circuitry may comprise or include the speaker.

According to a second aspect of the present disclosure, there is provided monitoring circuitry, comprising: a current monitoring unit operable to monitor a speaker current flowing through a speaker and generate a monitor signal indicative of that current; and a controller operable, based on a control signal, to control operation of the current monitoring unit to control the monitor signal.

The monitoring circuitry may comprise or include the speaker.

According to a third aspect of the present disclosure, there is provided a speaker current processing system, comprising: the monitoring circuitry of the first or second aspect; and a processor configured to process the monitor signal.

The processor may be configured to transition from a low-power state to a higher-power state based on the monitor signal. The processor may be configured to compare the monitor signal to at least one signature, and to analyse information represented by the monitor signal based on the comparison.

According to a fourth aspect of the present disclosure, there is provided a host device, comprising the monitoring circuitry of the first or second aspect or the speaker current processing system of the third aspect.

Also envisaged are corresponding method aspects, computer program aspects and storage medium aspects. Features of one aspect may be applied to another and vice versa.

BRIEF DESCRIPTION OF THE DRAWINGS

Reference will now be made, by way of example only, to the accompanying drawings, of which.

DETAILED DESCRIPTION

Figure 1:
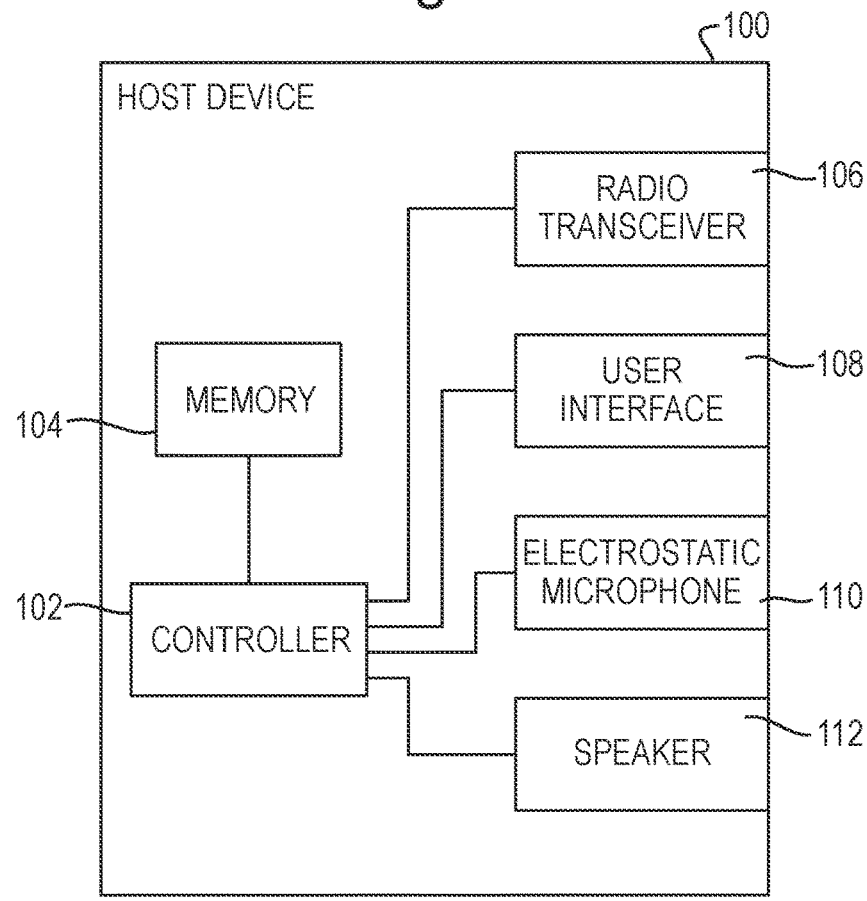
FIG. 1 is a schematic diagram of a host device.

FIG. 1 is a schematic diagram of a host device 100, which may be considered an electrical or electronic device.

For use as a comparative example, host device 100 may be considered to comprise monitoring circuitry 200 (not specifically shown) as will be explained in more detail in connection with FIG. 2.

In the case of embodiments, the host device comprises monitoring circuitry 400 (not specifically shown) or variations thereof 400A to 400D, instead of monitoring circuitry 200, as will be explained in more detail in connection with FIGS. 5A and 5B and the subsequent Figures. The monitoring circuitry 200 of FIG. 2 is described to enable a better understanding of the monitoring circuitry 400 and its variations. The host device may be referred to as monitoring circuitry itself or as a speaker current processing system. Similarly the monitoring circuitry 400 and its variations may be referred to as a speaker current processing system.

As shown in FIG. 1, mobile device 102 comprises a controller 102, a memory 104, a radio transceiver 106, a user interface 108, at least one microphone 110, and at least one speaker unit 112.

The host device may comprise an enclosure, i.e. any suitable housing, casing, or other enclosure for housing the various components of host device 100. The enclosure may be constructed from plastic, metal, and/or any other suitable materials. In addition, the enclosure may be adapted (e.g., sized and shaped) such that host device 100 is readily transported by a user of host device 100. Accordingly, host device 100 includes but is not limited to a mobile telephone such as a smart phone, an audio player, a video player, a PDA, a mobile computing platform such as a laptop computer or tablet computing device, a handheld computing device, a games device, or any other device that may be readily transported by a user.

Controller 102 is housed within the enclosure and includes any system, device, or apparatus configured to interpret and/or execute program instructions and/or process data, and may include, without limitation a microprocessor, microcontroller, digital signal processor (DSP), application specific integrated circuit (ASIC), or any other digital or analogue circuitry configured to interpret and/or execute program instructions and/or process data. In some arrangements, controller 102 interprets and/or executes program instructions and/or processes data stored in memory 104 and/or other computer-readable media accessible to controller 102.

Memory 104 may be housed within the enclosure, may be communicatively coupled to controller 102, and includes any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 100 is turned off.

User interface 108 may be housed at least partially within the enclosure, may be communicatively coupled to the controller 102, and comprises any instrumentality or aggregation of instrumentalities by which a user may interact with user host device 100. For example, user interface 108 may permit a user to input data and/or instructions into user host device 100 (e.g., via a keypad and/or touch screen), and/or otherwise manipulate host device 100 and its associated components. User interface 108 may also permit host device 100 to communicate data to a user, e.g., by way of a display device (e.g. touch screen).

Capacitive microphone 110 may be housed at least partially within enclosure 101, may be communicatively coupled to controller 102, and comprise any system, device, or apparatus configured to convert sound incident at microphone 110 to an electrical signal that may be processed by controller 102, wherein such sound is converted to an electrical signal using a diaphragm or membrane having an electrical capacitance that varies as based on sonic vibrations received at the diaphragm or membrane. Capacitive microphone 110 may include an electrostatic microphone, a condenser microphone, an electret microphone, a microelectomechanical systems (MEMs) microphone, or any other suitable capacitive microphone. In some arrangements multiple capacitive microphones 110 may be provided and employed selectively or together. In some arrangements the capacitive microphone 110 may not be provided, the speaker unit 112 being relied upon to serve as a microphone as explained later.

Radio transceiver 106 may be housed within the enclosure, may be communicatively coupled to controller 102, and includes any system, device, or apparatus configured to, with the aid of an antenna, generate and transmit radio-frequency signals as well as receive radio-frequency signals and convert the information carried by such received signals into a form usable by controller 102. Of course, radio transceiver 106 may be replaced with only a transmitter or only a receiver in some arrangements. Radio transceiver 106 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

The speaker unit 112 comprises a speaker (possibly along with supporting circuitry) and may be housed at least partially within the enclosure or may be external to the enclosure (e.g. attachable thereto in the case of headphones). As will be explained later, the monitoring circuitry (audio circuitry) 200 described in connection with FIG. 2 may be taken to correspond to the speaker unit 112 or to a combination of the speaker unit 112 and the controller 102. In some arrangements multiple speaker units 112 may be provided and employed selectively or together. As such, the monitoring circuitry 200 described in connection with FIG. 2 may be taken to be provided multiple times corresponding respectively to the multiple speaker units 112, although it need not be provided for each of those speaker units 112. Similar considerations apply to the monitoring circuitry 400 and variations thereof. The present disclosure will be understood accordingly.

The speaker unit 112 may be communicatively coupled to controller 102, and may comprise any system, device, or apparatus configured to produce sound in response to electrical audio signal input. In some arrangements, the speaker unit 112 may comprise as its speaker a dynamic loudspeaker.

A dynamic loudspeaker may be taken to employ a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

The speaker unit 112 may be considered to comprise as its speaker any audio transducer, including amongst others a microspeaker, loudspeaker, ear speaker, headphone, earbud or in-ear transducer, piezo speaker, and an electrostatic speaker.

In arrangements in which host device 100 includes a plurality of speaker units 112, such speaker units 112 may serve different functions. For example, in some arrangements, a first speaker unit 112 may play ringtones and/or other alerts while a second speaker unit 112 may play voice data (e.g., voice data received by radio transceiver 106 from another party to a phone call between such party and a user of host device 100). As another example, in some arrangements, a first speaker unit 112 may play voice data in a "speakerphone" mode of host device 100 while a second speaker unit 112 may play voice data when the speakerphone mode is disabled.

Although specific example components are depicted above in FIG. 1 as being integral to host device 100 (e.g., controller 102, memory 104, user interface 108, microphone 110, radio transceiver 106, speakers(s) unit 112), in some arrangements the host device 100 may comprise one or more components not specifically enumerated above. In other arrangements the host device 100 may comprise a subset of the components specifically enumerated above, for example it might not comprise the radio transceiver 106 and/or the microphone 110.

As mentioned above, one or more speakers units 112 may be employed as a microphone. For example, sound incident on a cone or other sound producing component of a speaker unit 112 may cause motion in such cone, thus causing motion of the voice coil of such speaker unit 112, which induces a voltage on the voice coil which may be sensed and transmitted to controller 102 and/or other circuitry for processing, effectively operating as a microphone. Sound detected by a speaker unit 112 used as a microphone may be used for many purposes.

For example, in some arrangements a speaker unit 112 may be used as a microphone to sense voice commands and/or other audio stimuli. These may be employed to carry out predefined actions (e.g. predefined voice commands may be used to trigger corresponding predefined actions).

Voice commands and/or other audio stimuli may be employed for "waking up" the host device 100 from a low-power state and transitioning it to a higher-power state. In such arrangements, when host device 100 is in a low-power state, a speaker unit 112 may communicate electronic signals (a microphone signal) to controller 102 for processing. Controller 102 may process such signals and determine if such signals correspond to a voice command and/or other stimulus for transitioning host device 100 to a higher-power state. If controller 102 determines that such signals correspond to a voice command and/or other stimulus for transitioning host device 100 to a higher-power state, controller 102 may activate one or more components of host device 100 that may have been deactivated in the low-power state (e.g., capacitive microphone 110, user interface 108, an applications processor forming part of the controller 102).

In some instances, a speaker unit 112 may be used as a microphone for sound pressure levels or volumes above a certain level, such as the recording of a live concert, for example. In such higher sound levels, a speaker unit 112 may have a more reliable signal response to sound as compared with capacitive microphone 110. When using a speaker unit 112 as a microphone, controller 102 and/or other components of host device 100 may perform frequency equalization, as the frequency response of a speaker unit 112 employed as a microphone may be different from that of capacitive microphone 110. Such frequency equalization may be accomplished using filters (e.g., a filter bank) as is known in the art. In particular arrangements, such filtering and frequency equalization may be adaptive, with an adaptive filtering algorithm performed by controller 102 during periods of time in which both capacitive microphone 110 is active (but not overloaded by the incident volume of sound) and a speaker unit 112 is used as a microphone. Once the frequency response is equalized, controller 102 may smoothly transition between the signals received from capacitive microphone 110 and speaker unit 112 by cross-fading between the two.

In some instances, a speaker unit 112 may be used as a microphone to enable identification of a user of the host device 100. For example, a speaker unit 112 (e.g. implemented as a headphone, earpiece or earbud) may be used as a microphone while a speaker signal is supplied to the speaker (e.g. to play sound such as music) or based on noise. In that case, the microphone signal may contain information about the ear canal of the user, enabling the user to be identified by analysing the microphone signal. For example, the microphone signal may indicate how the played sound or noise resonates in the ear canal, which may be specific to the ear canal concerned. Since the shape and size of each person's ear canal is unique, the resulting data could be used to distinguish a particular (e.g. "authorised") user from other users. Accordingly, the host device 100 (including the speaker unit 112) may be configured in this way to perform a biometric check (referred to as an 'ear biometric' check), similar to a fingerprint sensor or eye scanner.

It will be apparent that in some arrangements, a speaker unit 112 may be used as a microphone in those instances in which it is not otherwise being employed to emit sound. For example, when host device 100 is in a low-power state, a speaker unit 112 may not emit sound and thus may be employed as a microphone (e.g., to assist in waking host device 100 from the low-power state in response to voice activation commands, as described above). As another example, when host device 100 is in a speakerphone mode, a speaker unit 112 typically used for playing voice data to a user when host device 100 is not in a speakerphone mode (e.g., a speaker unit 112 the user typically holds to his or her ear during a telephonic conversation) may be deactivated from emitting sound and in such instance may be employed as a microphone.

However, in other arrangements (for example, in the case of the ear biometric check described above), a speaker unit 112 may be used simultaneously as a speaker and a microphone, such that a speaker unit 112 may simultaneously emit sound while capturing sound. In such arrangements, a cone and voice coil of a speaker unit 112 may vibrate both in response to a voltage signal applied to the voice coil and other sound incident upon speaker unit 112. As will become apparent from FIG. 2, the controller 102 and or the speaker unit 112 may determine a current flowing through the voice coil, which will exhibit the effects of: a voltage signal used to drive the speaker (e.g., based on a signal from the controller 102); and a voltage induced by external sound incident on the speaker unit 112. It will become apparent from FIG. 2 how the monitoring circuitry 200 enables a microphone signal (attributable to the external sound incident on the speaker of the speaker unit 112) to be recovered in this case.

In these and other arrangements, host device 100 may include at least two speaker units 112 which may be selectively used to transmit sound or as a microphone. In such arrangements, each speaker unit 112 may be optimized for performance at a particular volume level range and/or frequency range, and controller 102 may select which speaker unit(s) 112 to use for transmission of sound and which speaker unit(s) 112 to use for reception of sound based on detected volume level and/or frequency range.

Figure 2:
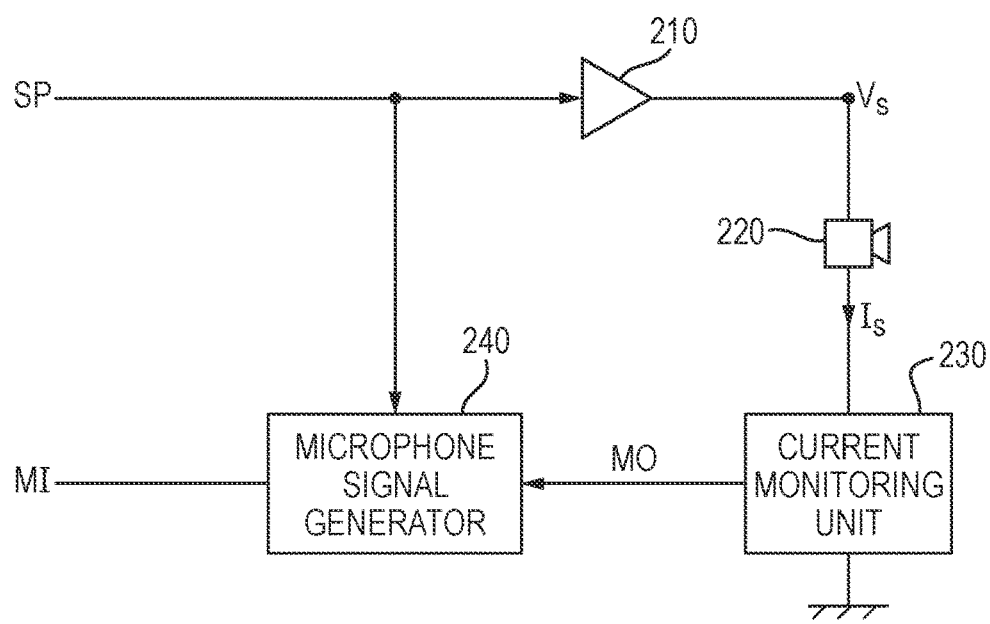
FIG. 2 is a schematic diagram of monitoring circuitry for use in the FIG. 1 host device, as a comparative example.

FIG. 2 is a schematic diagram of the monitoring circuitry 200, relating to a comparative example as mentioned earlier. The monitoring circuitry comprises a speaker driver 210, a speaker 220, a current monitoring unit 230 and a microphone signal generator 240.

For ease of explanation the monitoring circuitry 200 (including the speaker 220) will be considered hereinafter to correspond to the speaker unit 112 of FIG. 1, with the signals SP and MI in FIG. 2 (described later) effectively being communicated between the monitoring circuitry 200 and the controller 102.

The speaker driver 210 is configured, based on a speaker signal SP, to drive the speaker 220, in particular to drive a given speaker voltage signal $V_S$ on a signal line to which the speaker 220 is connected. The speaker 220 is connected between the signal line and ground, with the current monitoring unit 230 connected such that a speaker current $I_S$ flowing through the speaker 220 is monitored by the current monitoring unit 230.

Of course, this arrangement is shown schematically and is one example. In another arrangement the speaker 220 could be connected between the signal line and supply, again with the current monitoring unit 230 connected such that a speaker current $I_S$ flowing through the speaker 220 is monitored by the current monitoring unit 230. In yet another arrangement, the speaker driver 210 could be an H-bridge speaker driver with the speaker 220 then connected to be driven, e.g. in antiphase, at both ends. Again, the current monitoring unit 230 would be connected such that a speaker current $I_S$ flowing through the speaker 220 is monitored by the current monitoring unit 230. The present disclosure will be understood accordingly.

Returning to FIG. 2, the speaker driver 210 may be an amplifier such as a power amplifier. In some arrangements the speaker signal SP may be a digital signal, with the speaker driver 210 being digitally controlled. The voltage signal $V_S$ (effectively, the potential difference maintained over the combination of the speaker 220 and the current monitoring unit 230, indicative of the potential difference maintained over the speaker 220) may be an analogue voltage signal controlled based on the speaker signal SP. Of course, the speaker signal SP may also be an analogue signal. In any event, the speaker signal SP is indicative of a voltage signal applied to the speaker. That is, the speaker driver 210 may be configured to maintain a given voltage level of the voltage signal $V_S$ for a given value for the speaker signal SP, so that the value of the voltage signal $V_S$ is controlled by or related to (e.g. proportional to, at least within a linear operating range) the value of the speaker signal SP.

The speaker 220 may comprise a dynamic loudspeaker as mentioned above. Also as mentioned above, the speaker 220 may be considered any audio transducer, including amongst others a microspeaker, loudspeaker, ear speaker, headphone, earbud or in-ear transducer, piezo speaker, and an electrostatic speaker.

The current monitoring unit 230 is configured to monitor the speaker current $I_S$ flowing through the speaker and generate a monitor signal MO indicative of that current. The monitor signal MO may be a current signal or may be a voltage signal or digital signal indicative of (e.g. related to or proportional to) the speaker current $I_S$. In some arrangements, the speaker may be replaced with another type of sensor or transducer, whose current may similarly be monitored.

The microphone signal generator 240 is connected to receive the speaker signal SP and the monitor signal MO. The microphone signal generator 240 is operable, when external sound is incident on the speaker 220, to generate a microphone signal MI representative of the external sound, based on the monitor signal MO and the speaker signal SP. Of course, the speaker voltage signal $V_S$ is related to the speaker signal SP, and as such the microphone signal generator 240 may be connected to receive the speaker voltage signal $V_S$ instead of (or as well as) the speaker signal SP, and be operable to generate the microphone signal MI based thereon. The present disclosure will be understood accordingly.

As above, the speaker signal SP may be received from the controller 102, and the microphone signal MI may be provided to the controller 102, in the context of the host device 100. However, it will be appreciated that the monitoring circuitry 200 may be provided other than as part of the host device 100 in which case other control or processing circuitry may be provided to supply the speaker signal SP and receive the microphone signal MI, for example in a coupled accessory, e.g. a headset or earbud device.

Figure 3A:
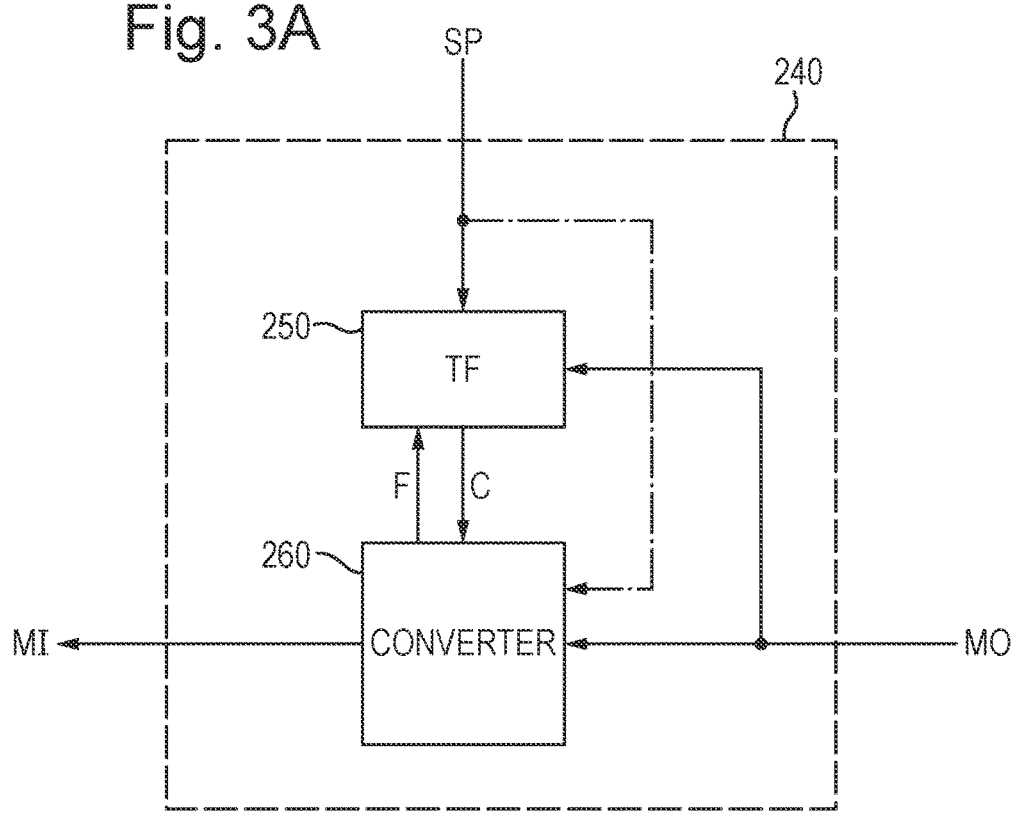
FIG. 3A is a schematic diagram of one implementation of the microphone signal generator of FIG. 2.

FIG. 3A is a schematic diagram of one implementation of the microphone signal generator 240 of FIG. 2. The microphone signal generator 240 in the FIG. 3A implementation comprises a transfer function unit 250 and a converter 260.

The transfer function unit 250 is connected to receive the speaker signal SP and the monitor signal MO, and to define and implement a transfer function which models (or is representative of, or simulates) at least the speaker 220. The transfer function may additionally model the speaker driver 210 and/or the current monitoring unit 230.

As such, the transfer function models in particular the performance of the speaker. Specifically, the transfer function (a transducer model) models how the speaker current $I_S$ is expected to vary based on the speaker signal SP (or the speaker voltage signal $V_S$) and any sound incident on the speaker 220. This of course relates to how the monitor signal MO will vary based on the same influencing factors.

By receiving the speaker signal SP and the monitor signal MO, the transfer function unit 250 is capable of defining the transfer function adaptively. That is the transfer function unit 250 is configured to determine the transfer function or parameters of the transfer function based on the monitor signal MO and the speaker signal SP. For example, the transfer function unit 250 may be configured to define, redefine or update the transfer function or parameters of the transfer function over time. Such an adaptive transfer function (enabling the operation of the converter 260 to be adapted as below) may adapt slowly and also compensate for delay and frequency response in the voltage signal applied to the speaker as compared to the speaker signal SP.

As one example, a pilot tone significantly below speaker resonance may be used (by way of a corresponding speaker signal SP) to adapt or train the transfer function. This may be useful for low-frequency response or overall gain. A pilot tone significantly above speaker resonance (e.g. ultrasonic) may be similarly used for high-frequency response, and a low-level noise signal may be used for the audible band. Of course, the transfer function may be adapted or trained using audible sounds e.g. in an initial setup or calibration phase, for example in factory calibration.

This adaptive updating of the transfer function unit 250 may operate most readily when there is no (incoming) sound incident on the speaker 220. However, over time the transfer function may iterate towards the "optimum" transfer function even when sound is (e.g. occasionally) incident on the speaker 220. Of course, the transfer function unit 250 may be provided with an initial transfer function or initial parameters of the transfer function (e.g. from memory) corresponding to a "standard" speaker 220, as a starting point for such adaptive updating.

For example, such an initial transfer function or initial parameters (i.e. parameter values) may be set in a factory calibration step, or pre-set based on design/prototype characterisation. For example, the transfer function unit 250 may be implemented as a storage of such parameters (e.g. coefficients). A further possibility is that the initial transfer function or initial parameters may be set based on extracting parameters in a separate process used for speaker protection purposes, and then deriving the initial transfer function or initial parameters based on those extracted parameters.

The converter 260 is connected to receive a control signal C from the transfer function unit 250, the control signal C reflecting the transfer function or parameters of the transfer function so that it defines the operation of the converter 260. Thus, the transfer function unit 250 is configured by way of the control signal C to define, redefine or update the operation of the converter 260 as the transfer function or parameters of the transfer function change. For example, the transfer function of the transfer function unit 250 may over time be adapted to better model at least the speaker 220.

The converter 260 (e.g. a filter) is configured to convert the monitor signal MO into the microphone signal MI, in effect generating the microphone signal MI. As indicated by the dot-dash signal path in FIG. 3A, the converter 260 (as defined by the control signal C) may be configured to generate the microphone signal MI based on the speaker signal SP and the monitor signal MO.

Note that the converter 260 is shown in FIG. 3A as also supplying a feedback signal F to the transfer function unit 250. The use of the feedback signal F in this way is optional. It will be understood that the transfer function unit 250 may receive the feedback signal F from the converter 260, such that the transfer function modelled by the transfer function unit 250 can be adaptively updated or tuned based on the feedback signal F, e.g. based on an error signal F received from the converter unit 260. The feedback signal F may be supplied to the transfer function unit 250 instead of or in addition to the monitor signal MO. In this regard, a detailed implementation of the microphone signal generator 240 will be explored later in connection with FIG. 3B.

It will be appreciated that there are four basic possibilities in relation to the speaker 220 emitting sound and receiving incoming sound. These will be considered in turn. For convenience the speaker signal SP will be denoted an "emit" speaker signal when it is intended that the speaker emits sound (e.g. to play music) and a "non-emit" speaker signal when it is intended that the speaker does not, or substantially does not, emit sound (corresponding to the speaker being silent or appearing to be off). An emit speaker signal may be termed a "speaker on", or "active" speaker signal, and have values which cause the speaker to emit sound (e.g. to play music). A non-emit speaker signal may be termed a "speaker off", or "inactive" or "dormant" speaker signal, and have a value or values which cause the speaker to not, or substantially not, emit sound (corresponding to the speaker being silent or appearing to be off).

The first possibility is that the speaker signal SP is an emit speaker signal, and that there is no significant (incoming) sound incident on the speaker 220 (even based on reflected or echoed emitted sound). In this case the speaker driver 210 is operable to drive the speaker 220 so that it emits a corresponding sound signal, and it would be expected that the monitor signal MO comprises a speaker component resulting from (attributable to) the speaker signal but no microphone component resulting from external sound (in the ideal case). There may of course be other components, e.g. attributable to circuit noise. This first possibility may be particularly suitable for the transfer function unit 250 to define/redefine/update the transfer function based on the speaker signal SP and the monitor signal MO, given the absence of a microphone component resulting from external sound. The converter 260 here (in the ideal case) outputs the microphone signal MI such that it indicates no (incoming) sound incident on the speaker, i.e. silence. Of course, in practice there may always be a microphone component if only a small, negligible one.

The second possibility is that the speaker signal SP is an emit speaker signal, and that there is significant (incoming) sound incident on the speaker 220 (perhaps based on reflected or echoed emitted sound). In this case the speaker driver 210 is again operable to drive the speaker 220 so that it emits a corresponding sound signal. Here, however, it would be expected that the monitor signal MO comprises a speaker component resulting from (attributable to) the speaker signal and also a significant microphone component resulting from the external sound (effectively due to a back EMF caused as the incident sound applies a force to the speaker membrane). There may of course be other components, e.g. attributable to circuit noise. In this second possibility, the converter 260 outputs the microphone signal MI such that it represents the (incoming) sound incident on the speaker. That is, the converter 260 effectively filters out the speaker component and/or equalises and/or isolates the microphone component when converting the monitor signal MO into the microphone signal MI.

The third possibility is that the speaker signal SP is a non-emit speaker signal, and that there is significant (incoming) sound incident on the speaker 220. In this case the speaker driver 210 is operable to drive the speaker 220 so that it substantially does not emit a sound signal. For example, the speaker driver 210 may drive the speaker 220 with a speaker voltage signal $V_S$ which is substantially a DC signal, for example at 0V relative to ground. Here, it would be expected that the monitor signal MO comprises a significant microphone component resulting from the external sound but no speaker component. There may of course be other components, e.g. attributable to circuit noise. In the third possibility, the converter 260 outputs the microphone signal MI again such that it represents the (incoming) sound incident on the speaker. In this case, the converter effectively isolates the microphone component when converting the monitor signal MO into the microphone signal MI.

The fourth possibility is that the speaker signal SP is a non-emit speaker signal, and that there is no significant (incoming) sound incident on the speaker 220. In this case the speaker driver 210 is again operable to drive the speaker 220 so that it substantially does not emit a sound signal. Here, it would be expected that the monitor signal MO comprises neither a significant microphone component nor a speaker component. There may of course be other components, e.g. attributable to circuit noise. In the fourth possibility, the converter 260 outputs the microphone signal MI such that it indicates no (incoming) sound incident on the speaker, i.e. silence.

At this juncture, it is noted that the monitor signal MO is indicative of the speaker current $I_S$ rather than a voltage such as the speaker voltage signal $V_S$. Although it would be possible for the monitor signal MO to be indicative of a voltage such as the speaker voltage signal $V_S$ in a case where the speaker driver 210 is effectively disconnected (such that the speaker 220 is undriven) and replaced with a sensing circuit (such as an analogue-to-digital converter), this mode of operation may be unsuitable or inaccurate where the speaker 220 is driven by the speaker driver 210 (both where the speaker signal SP is a non-emit speaker signal and an emit speaker signal) and there is significant sound incident on the speaker 220.

This is because the speaker driver 210 effectively forces the speaker voltage signal $V_S$ to have a value based on the value of the speaker signal SP as mentioned above. Thus, any induced voltage effect (Vemf due to membrane displacement) of significant sound incident on the speaker 220 would be largely or completely lost in e.g. the speaker voltage signal $V_S$ given the likely driving capability of the speaker driver 210. However, the speaker current $I_S$ in this case would exhibit components attributable to the speaker signal and also any significant incident external sound, which translate into corresponding components in the monitor signal MO (where it is indicative of the speaker current $I_S$) as discussed above. As such, having the monitor signal MO indicative of the speaker current $I_S$ as discussed above enables a common architecture to be employed for all four possibilities mentioned above.

Although not explicitly shown in FIG. 3A, the converter 260 may be configured to perform conversion so that the microphone signal MI is output as a signal which is more usefully representative of the external sound (e.g. as a sound pressure level signal). Such conversion may involve some scaling and possibly some equalisation over frequency, for example. The monitor signal MO is indicative of the current signal $I_S$, and may even be a current signal itself. However, the circuitry such as controller 102 receiving the microphone signal MI may require that signal MI to be a sound pressure level (SPL) signal. The converter 260 may be configured to perform the conversion in accordance with a corresponding conversion function. As such, the converter 260 may comprise a conversion function unit (not shown) equivalent to the transfer function unit 250 and which is similarly configured to update, define or redefine the conversion function being implemented in an adaptive manner, for example based on any or all of the monitor signal MO, the speaker signal SP, the microphone signal MI, the feedback signal F, and the control signal C.

The skilled person will appreciate, in the context of the speaker 220, that the transfer function and/or the conversion function may be defined at least in part by Thiele-Small parameters. Such parameters may be reused from speaker protection or other processing. Thus, the operation of the transfer function unit 250, the converter 260 and/or the conversion function unit (not shown) may be defined at least in part by such Thiele-Small parameters. As is well known, Thiele-Small parameters (Thiele/Small parameters, TS parameters or TSP) are a set of electromechanical parameters that define the specified low frequency performance of a speaker. These parameters may be used to simulate or model the position, velocity and acceleration of the diaphragm, the input impedance and the sound output of a system comprising the speaker and its enclosure.

Figure 3B:
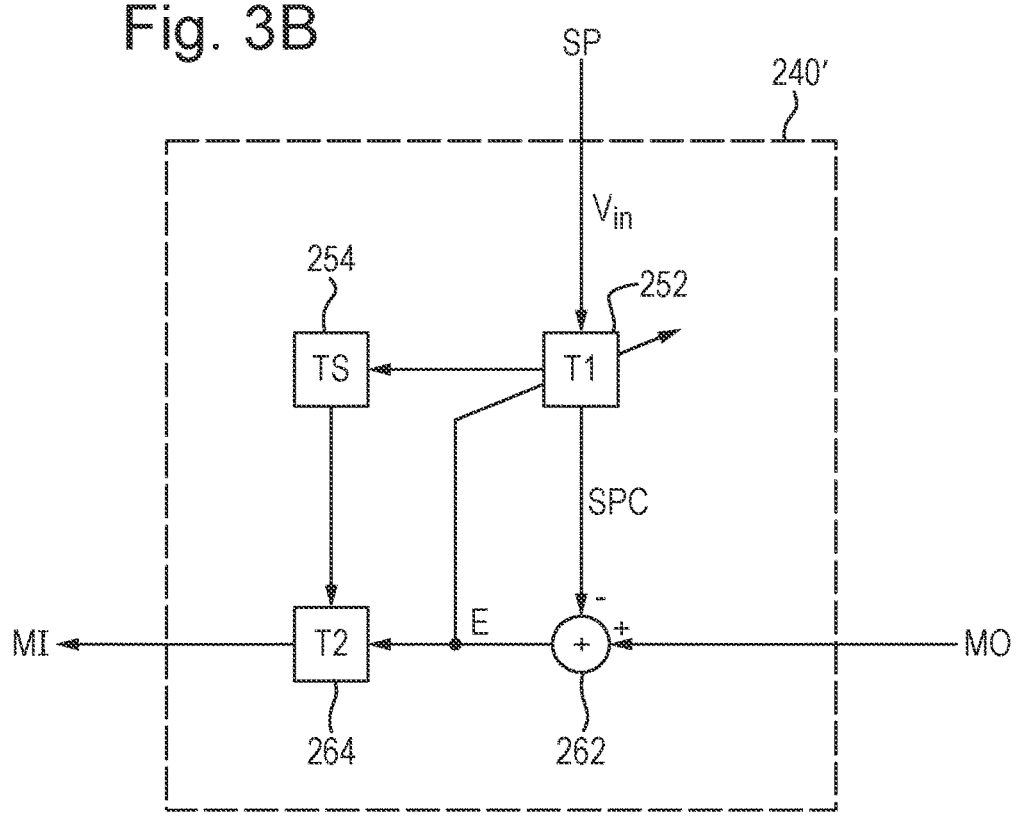
FIG. 3B is a schematic diagram of another implementation of the microphone signal generator of FIG. 2.

FIG. 3B is a schematic diagram of one implementation of the microphone signal generator 240 of FIG. 2, here denoted 240'. The microphone signal generator 240' in the FIG. 3B implementation comprises a first transfer function unit 252, an adder/subtractor 262, a second transfer function unit 264 and a TS parameter unit 254.

The first transfer function unit 252 is configured to define and implement a first transfer function, T1. The second transfer function unit 264 is configured to define and implement a second transfer function, T2. The TS parameter unit 254 is configured to store TS (Thiele-Small) parameters or coefficients extracted from the first transfer function T1 to be applied to the second transfer function T2.

The first transfer function, T1, may be considered to model at least the speaker 220. The first transfer function unit 252 is connected to receive the speaker signal SP (which will be referred to here as Vin), and to output a speaker current signal SPC indicative of the expected or predicted (modelled) speaker current based on the speaker signal SP.

The adder/subtractor 262 is connected to receive the monitor signal MO (indicative of the actual speaker current IS) and the speaker current signal SPC, and to output an error signal E which is indicative of the residual current representative of the external sound incident on the speaker 220. As indicated in FIG. 3B, the first transfer function unit 252, and as such the first transfer function T1, is configured to be adaptive based on the error signal E supplied to the first transfer function unit 252. The error signal E in FIG. 3B may be compared with the feedback signal F in FIG. 3A.

The second transfer function, T2, may be suitable to convert the error signal output by the adder/subtractor 262 into a suitable SPL signal (forming the microphone signal MI) as mentioned above. Parameters or coefficients of the first transfer function T1 may be stored in the TS parameter unit 254 and applied to the second transfer function T2.

The first transfer function T1 may be referred to as an adaptive filter. The parameters or coefficients (in this case, Thiele-Small coefficients TS) of the first transfer function T1 may be extracted and applied to the second transfer function T2, by way of the TS parameter unit 254, which may be a storage unit. The second transfer function T2 may be considered an equalisation filter.

Looking at FIG. 3B, for example, T2 is the transfer function applied between E and MI, hence T2=(MI/E), or MI=T2*E, where E=(MO−SPC). Similarly, T1=(SPC/SP), or SPC=T1*SP.

Example transfer functions T1 and T2 derived from Thiele-Small modelling may comprise:

$$T1 = \frac{Vin}{R + s\left(L + \frac{Bl^2 \cdot Cms}{1 + s \cdot Cms(Rms + Mms)}\right)}$$

$$T2 = -\frac{R(1 + s \cdot Cms(Rms + Mms)) + s + (L + Cms(-Bl^2 + L \cdot s(Rms + Mms)))}{s \cdot Bl \cdot Cms}$$

where:
- Vin is the voltage level of (or indicated by) the speaker signal SP;
- R is equivalent to Re, which is the DC resistance (DCR) of the voice coil measured in ohms (Ω), and best measured with the speaker cone blocked, or prevented from moving or vibrating;
- L is equivalent to Le, which is the inductance of the voice coil measured in millihenries (mH);
- Bl is known as the force factor, and is a measure of the force generated by a given current flowing through the voice coil of the speaker, and is measured in tesla metres (Tm);
- Cms describes the compliance of the suspension of the speaker, and is measured in metres per Newton (m/N);
- Rms is a measurement of the losses or damping in the speaker's suspension and moving system. Units are not normally given but it is in mechanical 'ohms';
- Mms is the mass of the cone, coil and other moving parts of a driver, including the acoustic load imposed by the air in contact with the driver cone, and is measured in grams (g) or kilograms (kg);
- s is the Laplace variable; and
- In general, reference regarding Thiele-Small parameters may be made to Beranek, Leo L. (1954). Acoustics. NY: McGraw-Hill.

Figure 4:
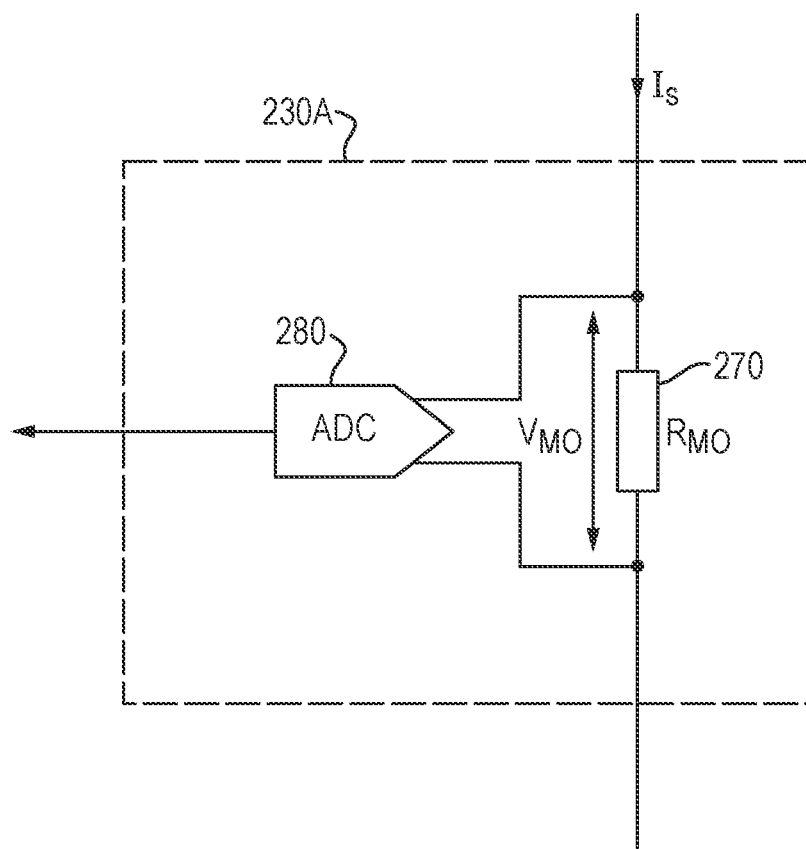
FIG. 4 is a schematic diagram of an example current monitoring unit, as an implementation of the current monitoring unit shown in FIG. 2.

FIG. 4 is a schematic diagram of an example current monitoring unit 230A which may be considered an implementation of the current monitoring unit 230 of FIG. 2. The current monitoring unit 230A may thus be used in place of the current monitoring unit 230.

The current monitoring unit 230A comprises an impedance 270 and an analogue-to-digital converter (ADC) 280. The impedance 270 is in the present arrangement a resistor having a monitoring resistance $R_{MO}$, and is connected in series in the current path carrying the speaker current $I_S$. Thus a monitoring voltage $V_{MO}$ is developed over the resistor 270 such that:

$$V_{MO} = I_S \times R_{MO}$$

The monitoring voltage $V_{MO}$ is thus proportional to the speaker current $I_S$ given the fixed monitoring resistance $R_{MO}$ of the resistor 270. Indeed, it will be appreciated from the above equation that the speaker current $I_S$ could readily be obtained from the monitoring voltage $V_{MO}$ given a known RMO.

The ADC 280 is connected to receive the monitoring voltage $V_{MO}$ as an analogue input signal and to output the monitor signal MO as a digital signal. The microphone signal generator 240 (including the transfer function unit 250 and converter 260) may be implemented in digital such that the speaker signal SP, the monitor signal MO and the microphone signal MI are digital signals.

One issue with the arrangement in FIG. 4 is that the monitoring resistance $R_{MO}$ is connected in series in the current path carrying the speaker current $I_S$. Whereas this may be acceptable in cases where the speaker current $I_S$ is always being monitored, it is envisaged that there may be cases where the current need not be measured all of the time, even when the speaker is active (as a speaker or as a microphone). For example, some tasks, such as ear biometrics as explained earlier, may involve monitoring the speaker current but only intermittently (e.g. from time to time). Using the monitoring resistance $R_{MO}$ may for example lead to a trade-off of SNR versus efficiency, particularly where the monitoring resistance $R_{MO}$ is connected in series in the current path carrying the speaker current $I_S$. Looking at FIG. 4, the smaller $R_{MO}$ is, the smaller the sense signal $V_{MO}$ and the better the ADC 280 need be (in the sense of its accuracy or performance). Conversely, if $R_{MO}$ is larger the SNR problems of the ADC are alleviated, but the resistor now dissipates a significant amount of power regardless of whether the measurement is being performed or not.

Figure 5A:
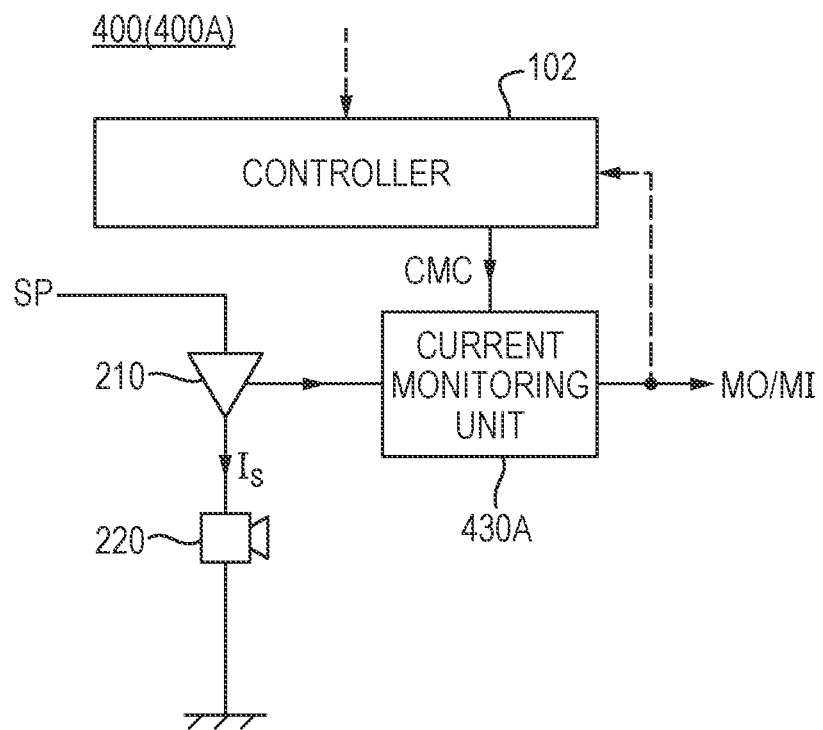
FIGS. 5A and 5B are schematic diagrams of monitoring circuitry for use in the FIG. 1 host device, relating to embodiments.
Figure 5B:
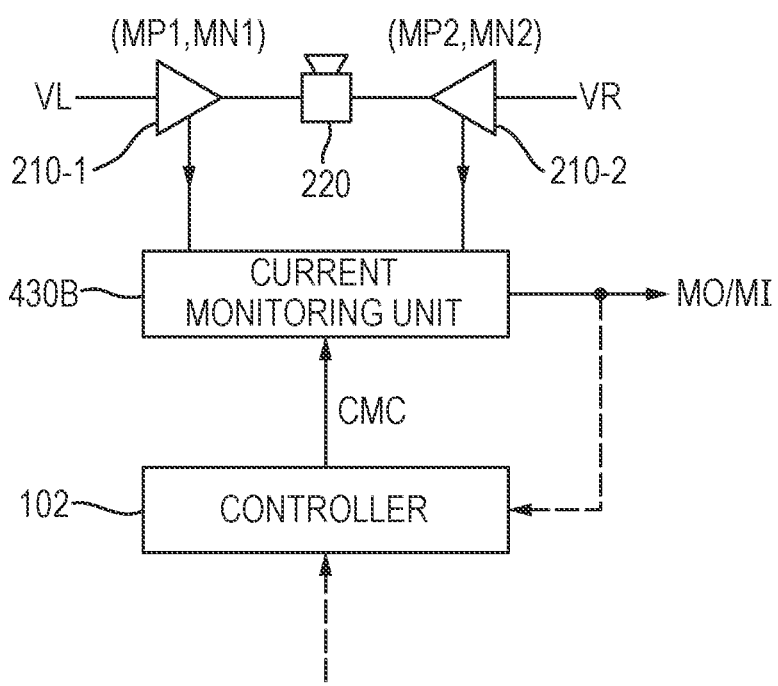

FIGS. 5A and 5B are schematic diagrams representative of monitoring circuitry 400 which may be used in place of the monitoring circuitry 200, to enable the speaker current $I_S$ to be measured (e.g. with high SNR) when needed but otherwise to have minimal power impact when the measurement is not needed. FIGS. 5A and 5B show variations 400A and 400B, respectively, of such monitoring circuitry 400, simply to demonstrate that the basic principle can be applied no matter how the speaker is driven.

Turning first to the monitoring circuitry 400A in FIG. 5A, the speaker 220 is shown as being driven by a speaker driver 210 based on a speaker signal SP (as in FIG. 2). However, rather than having the current monitoring unit 230 shown in the current path carrying the speaker current $I_S$, a current monitoring unit 430A is provided 'alongside' the speaker driver so that the speaker current $I_S$ can be monitored with generation of a monitor signal MO without requiring a dedicated or additional load (such as the monitoring resistance $R_{MO}$ in FIG. 4) in the path of the speaker current $I_S$. An example technique for monitoring the speaker current in this way will be explained later herein.

By being effectively out of the speaker current path, the current monitoring unit 430A may be controlled e.g. to be 'active' in the sense that the speaker current $I_S$ is being monitored with an associated power impact, or 'inactive', in the sense that the speaker current $I_S$ is not being monitored and the power impact associated with the 'active' monitoring is saved or reduced. That is, the current monitoring unit 430A may have 'active' and 'inactive' modes of operation, which can be selected based on a control signal. The current monitoring unit 430A may also, or alternatively, be controlled to control one or more properties of the monitor signal MO, such as a frequency bandwidth, SNR, dynamic range or gain. That is, the current monitoring unit 430A may have a plurality of 'active' modes of operation, which can be selected based on a control signal, those active modes controlling the monitor signal MO to have different properties or property values. The controller 102 is shown in FIG. 5A as providing a current-monitoring control signal CMC to the current monitoring unit 430A in order to effect this control, which may be based on the monitor signal MO or another signal such as a mode-selection signal (as indicated by dashed lines). In relation to such another signal, it is noted from FIG. 1 that the controller 102 may be controlled based on a signal received from any of the elements of the host device 100 (e.g. based on a user input via the user interface 108, or based on an internal control signal generated by the controller 102 itself).

Turning next to the monitoring circuitry 400B in FIG. 5B, being another variation of the monitoring circuitry 400, the speaker 220 is shown as being driven by a pair of speaker drivers (amplifiers) 210-1 and 210-2, which together make up the speaker driver 210, based on driving signals VL (left) and VR (right) as indicated (equivalent to the speaker signal SP in FIG. 5A). Effectively, in this case the speaker driver 210 is an H-bridge speaker driver or bridge tied amplifier (e.g. linear amplifier or class D amplifier with AD or BD modulation) with the speaker 220 then connected to be driven, e.g. in antiphase, at both ends as mentioned earlier. This form of driving the speaker 220 will be taken forwards as a running example.

Again, rather than having the current monitoring unit 230 in the current path carrying the speaker current, a current monitoring unit 430B (equivalent to current monitoring unit 430A) is provided 'alongside' the speaker driver so that the speaker current can be monitored with generation of a monitor signal MO without requiring a dedicated load (such as the monitoring resistance RMO in FIG. 4) in the path of the speaker current. As above, an example technique for monitoring the speaker current in this way will be explained later herein.

As with FIG. 5A, the current monitoring unit 430B of FIG. 5B may be controlled to e.g. to be 'active' or 'inactive', and/or to control one or more properties of the monitor signal MO. That is, the current monitoring unit 430B may have 'active' and 'inactive' modes of operation which may be selected as for the current monitoring unit 430A. The controller 102 is shown in FIG. 5B as providing a current-monitoring control signal CMC to the current monitoring unit 430B in order to effect this control, which may be based on the monitor signal MO or another signal (as indicated by dashed lines), as before.

In both of FIGS. 5A and 5B, the microphone signal generator 240 (see FIG. 2), for generating the microphone signal MI from the monitor signal MO, is not shown to avoid over complication, and instead the output signals of the current monitoring units 430A and 430B are shown as being the monitor signal MO and/or the microphone signal MI. It will be appreciated therefore that the microphone signal generator 240 may be present in the monitoring circuitry 400A or 400B (similarly to FIG. 2), or may be absent. Similarly, the controller 102 may be controlled by the monitor signal MO and/or the microphone signal MI. The monitor signal MO will be referred to hereinafter, however it will be appreciated that this may be taken as being a reference to the monitor signal MO and/or the microphone signal MI, and this will be indicated in the drawings as MO/MI.

Figure 6A:
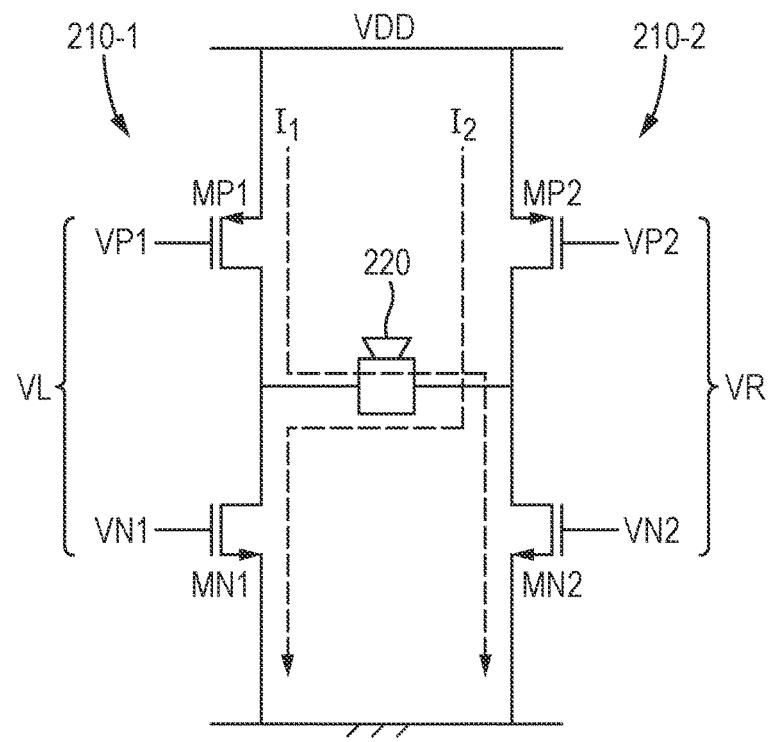
FIGS. 6A and 6B are schematic diagrams showing an implementation of the speaker driver shown in FIG. 5B.

In order to better understand the running example shown schematically in FIG. 5B, FIG. 6A is a schematic diagram showing an implementation of the speaker driver 210 of FIG. 5B connected to drive the speaker 220. Here, only the output stages of the amplifiers 210-1 and 210-2 are shown (corresponding to a CMOS output stage as may be found in class D and class AB amplifiers), implemented by way of field-effect transistors MP1, MN1, MP2, MN2, which may be MOSFETs. Of course, other types of transistor (such as bipolar junction transistors) could be used. MP1, MN1, MP2, MN2 are marked on FIG. 5B to aid in a comparison between the Figures.

Transistors MP1, MP2 are p-channel devices and transistors MN1, MN2 are n-channel devices. The driving signals VL and VR are represented at the output stages as gate signals VP1 and VN1 (which correspond to VL) driving transistors MP1 and MN1, respectively, and VP2 and VN2 (which correspond to VR) driving transistors MP2 and MN2, respectively.

As shown in FIG. 6A, the channels of transistors MP1 and MN1 are connected either side of an intermediate node along a left-hand current path extending from VDD (supply) to GND (ground), and similarly the channels of transistors MP2 and MN2 are connected either side of an intermediate node along a right-hand current path extending from VDD to GND. The speaker 220 is connected between the intermediate nodes of the two current paths.

Two possible speaker currents $I_1$ and $I_2$, passing via the speaker 220, are shown explicitly. It will be appreciated that, to monitor the speaker current (load current of the speaker 220) in this case it could be possible to monitor e.g. only the current flowing through the NMOS devices MN1 and MN2 (to measure both of currents $I_1$ and $I_2$) or only the current flowing through one of the NMOS devices MN1 and MN2 (to measure only one of currents $I_1$ and $I_2$).

Figure 6B:
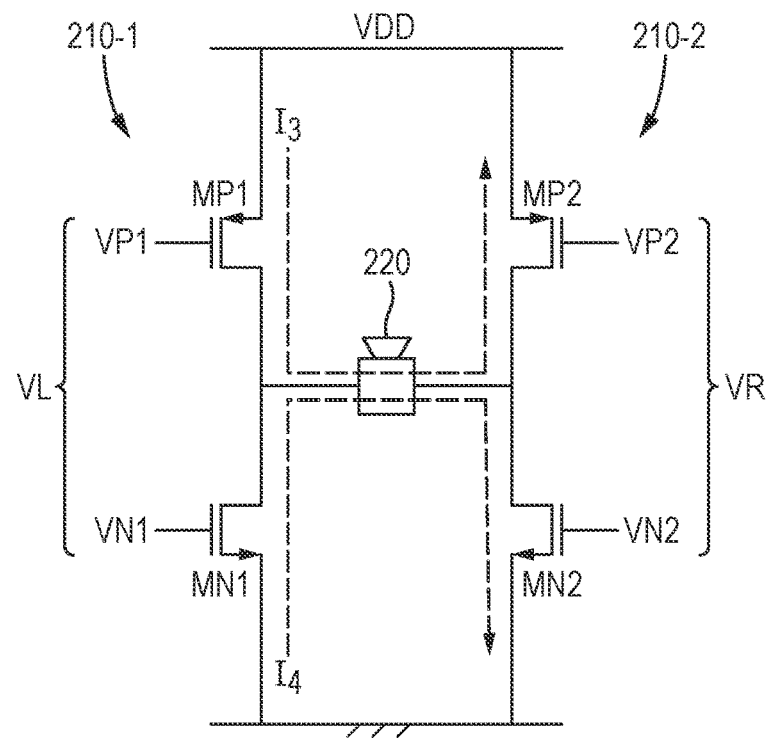

FIG. 6B is a schematic diagram showing the same implementation as in FIG. 6A, to indicate that for a class D amplifier with BD modulation there are two additional speaker currents (current paths) $I_3$ and $I_4$ to consider. To monitor the speaker current (load current of the speaker 220) in this case, it may thus be necessary to monitor the current flowing through (at least one of) the PMOS devices as well through (at least one of) the NMOS devices.

In the light of FIGS. 6A and 6B, it will be appreciated that the current monitoring unit 430B of FIG. 5B may be configured to monitor the current flowing through any one of (or any combination of) the transistors MP1, MN1, MP2, MN2 of FIGS. 6A and 6B, depending on the application. For simplicity, the running example will be carried forward with consideration of monitoring the current flowing through transistor MN1. The current flowing through the transistor MN1 will therefore be referred to as the speaker current going forwards for simplicity (and be considered equivalent to the speaker current $I_S$ in FIGS. 2 and 5A).

Figure 7:
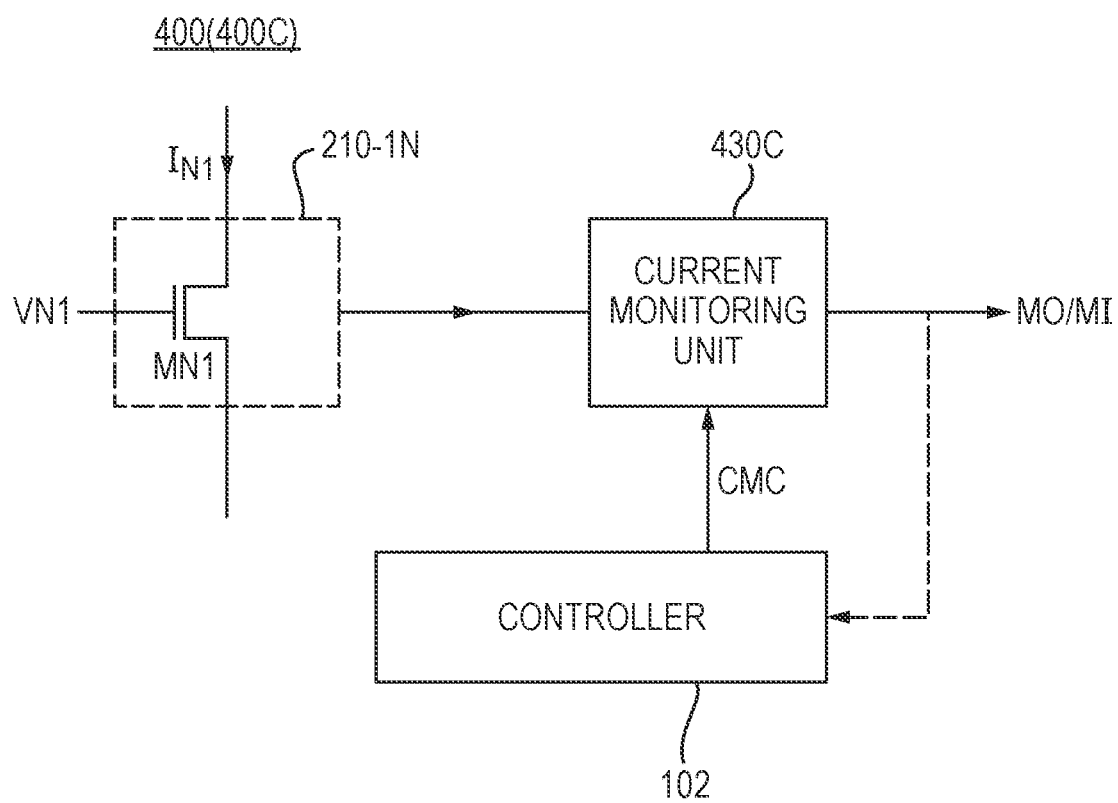
FIG. 7 is a schematic diagram of monitoring circuitry for use in the FIG. 1 host device, relating to an embodiment.

FIG. 7 is a schematic diagram of monitoring circuitry 400C which may be considered another variation of the monitoring circuitry 400 and an implementation of the monitoring circuitry 400B which takes into account FIGS. 6A and 6B and the running example in which the current flowing through transistor MN1 is monitored as the speaker current $I_S$, that current denoted as $I_{N1}$.

The speaker drivers 210-1 and 210-2 and the speaker 220 in FIG. 5B are represented in FIG. 7 by just the transistor MN1 (which may be considered a speaker driver 210-1N, and part of the speaker driver 210-1). Also, the current monitoring unit 430B has been replaced with a current monitoring unit 430C, connected to monitor the current $I_{N1}$ specifically. The monitoring circuitry 400C may thus be considered a simplification of the monitoring circuitry 400B, the latter of which may be equipped to measure the current through any one of (or any combination of) the transistors MP1, MN1, MP2, MN2 as mentioned above in a similar way.

It can be seen that the concept uniting the monitoring circuitry 400A to 400C, generically the monitoring circuitry 400, is that in each case the circuitry comprises a current monitoring unit operable to monitor a speaker current flowing through the speaker 220 and generate the monitor signal MO indicative of that current, and the controller 102, being operable, based on a control signal (such as the monitor signal MO), to control the current monitoring unit to control whether the monitor signal MO is generated and/or a property of the monitor signal MO. Further, the current monitoring is done without imposing an additional or dedicated load in the path of the speaker current.

Figure 8:
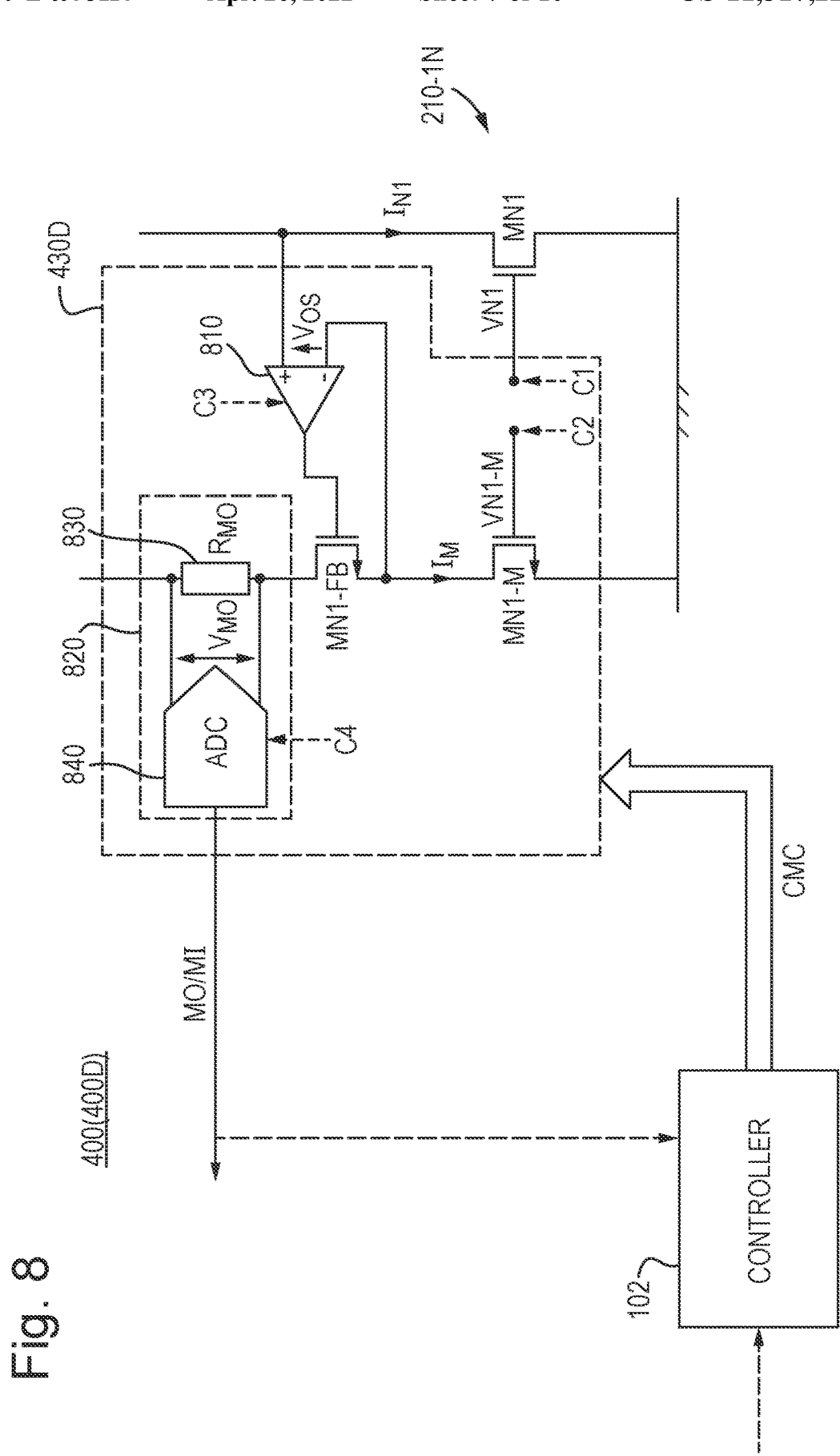
FIG. 8 is a schematic diagram of monitoring circuitry for use in the FIG. 1 host device, relating to an embodiment.

FIG. 8 is a schematic diagram of monitoring circuitry 400D, being another variation of the monitoring circuitry 400 and a detailed example implementation of the monitoring circuitry 400C. As compared to FIG. 7, the current monitoring unit 430C has been replaced with a current monitoring unit 430D, the latter being a detailed example implementation of the former. Focus will therefore be placed on the current monitoring unit 430D and how it may be controlled by the controller 102.

In overview, the current monitoring unit 430D makes use of a current mirror, i.e. a current mirror arrangement of transistors, to monitor the speaker current without imposing a dedicated load in its path.

In detail, the current monitoring unit 430D comprises a field-effect transistor MN1-M, being a mirror transistor corresponding to transistor MN1, and a further field-effect transistor MN1-FB serving as a feedback component. It is recalled that the transistor MN1 is part of the speaker driver 210, 210-1 and thus is not an additional load in the path of the speaker current. The transistors MN1-M and MN1-FB may be MOSFETs and are n-channel devices for consistency with transistor MN1. The transistors MN1-M and MN1-FB are connected with their channels in series along the same current path.

Further, the transistors MN1 and MN1-M are connected along respective current paths with their source terminals connected to GND (ground supply) so that their source voltages are the same as one another.

The transistor MN1 is connected to be driven by a gate voltage VN1, as mentioned earlier, in order to play its part in driving the speaker 220 (not shown), and as a result carries current $I_{N1}$ being the speaker current or part thereof. This gate voltage VN1 is shown as provided by a control signal C1 being part of the control signal CMC provided by the controller 102 (and will be controlled to drive the speaker 220). The transistor MN1-M is similarly connected to be driven by a gate voltage VN1-M. This gate voltage VN1-M is shown as provided by a control signal C2 being part of the control signal CMC provided by the controller 102.

When the gate voltages VN1 and VN1-M are controlled to be the same as each other, and when the drain voltages of the transistors MN1 and MN1-M are similarly the same as each other, the transistors MN1 and MN1-M act as a current mirror such that a mirror current $I_M$ is caused to flow through the mirror transistor MN1-M, where a magnitude of the mirror current $I_M$ is dependent on (e.g. proportional to) a magnitude of the speaker current $I_{N1}$ due to current mirroring. In this sense, the mirror current $I_M$ mirrors the speaker current $I_{N1}$.

The current monitoring unit 430D further comprises a differential amplifier 810, for example an operational amplifier or an operational transconductance amplifier (OTA), having non-inverting (+) and inverting (−) inputs, and an output. The non-inverting input is connected to be controlled by the drain voltage (effectively, drain-source voltage) of the transistor MN1 and the inverting input is connected to be controlled by the drain voltage (effectively, drain-source voltage) of the mirror transistor MN1-M. The output is connected to control the gate voltage of the feedback component (transistor) MN1-FB.

In this way, the differential amplifier 810 is configured to control the feedback component MN1-FB to cause the drain-source (drain) voltage of the mirror transistor MN1-M to track or become the same as the drain-source (drain) voltage of the transistor MN1. This control is performed based on a feedback potential difference applied between inputs of the differential amplifier being a difference between the drain-source (drain) voltage of transistor MN1 and the drain-source (drain) voltage of the transistor MN1-M. Depending on the relative sizes of the transistors MN1 and MN1-M (they may be scaled relative to one another), this causes the mirror current $I_M$ to track or become the same as the speaker current $I_N$.

It is noted recalled here that the transistor MN1 represents an output stage of the speaker driver/amplifier 210 or 210-1.

In order for the mirror current $I_M$ to be generated, the output stage (in particular, transistor MN1 in FIG. 8) would need to be enabled to carry current. The output stage could be enabled, with the devices such as MN1 controlled to be ON, even if the speaker driver/amplifier 210 or 210-1 is off in the sense of not driving the speaker to emit sound. In this way, sound incident on the speaker may be 'picked up' even in the case where the speaker is not being driven to emit sound.

As indicated in FIG. 8, the differential amplifier 810 may be controlled by a control signal C3 being part of the control signal CMC provided by the controller 102. Such potential control will be discussed later herein.

The current monitoring unit 430D further comprises a generator 820 operable to generate the monitor signal MO based on the mirror current $I_M$ (which itself is based on the speaker current $I_{N1}$).

One particular implementation of the generator 820 is shown in FIG. 8 itself, in which the generator 820 comprises an impedance 830 and an analogue-to-digital converter (ADC) 840. Similarly to FIG. 4, the impedance 830 is (in the present arrangement) a resistor having a monitoring resistance $R_{MO}$, and is connected in series in the current path carrying the mirror current $I_M$. Thus, a monitoring voltage $V_{MO}$ is developed over the resistor 830 such that:

$$V_{MO} = I_S \times R_{MO}$$

The monitoring voltage $V_{MO}$ is thus proportional to the mirror current $I_M$ (and also the speaker current $I_{N1}$) given the fixed monitoring resistance $R_{MO}$ of the resistor 830, and the linear current mirroring of the current mirror formed by the transistors MN1 and MN1-M and the differential amplifier 810. It will be appreciated from the above equation that the mirror current $I_M$ could readily be obtained from the monitoring voltage $V_{MO}$ given a known $R_{MO}$. Further, this mirror current $I_M$ will be related to the speaker current $I_{N1}$ due to the current mirroring.

The ADC 840 is connected to receive the monitoring voltage $V_{MO}$ as an analogue input signal and to output the monitor signal MO as a digital signal. As indicated in FIG. 8, the ADC 840 may be controlled by a control signal C4 being part of the control signal CMC provided by the controller 102. Such potential control will be discussed later herein.

Figure 9:
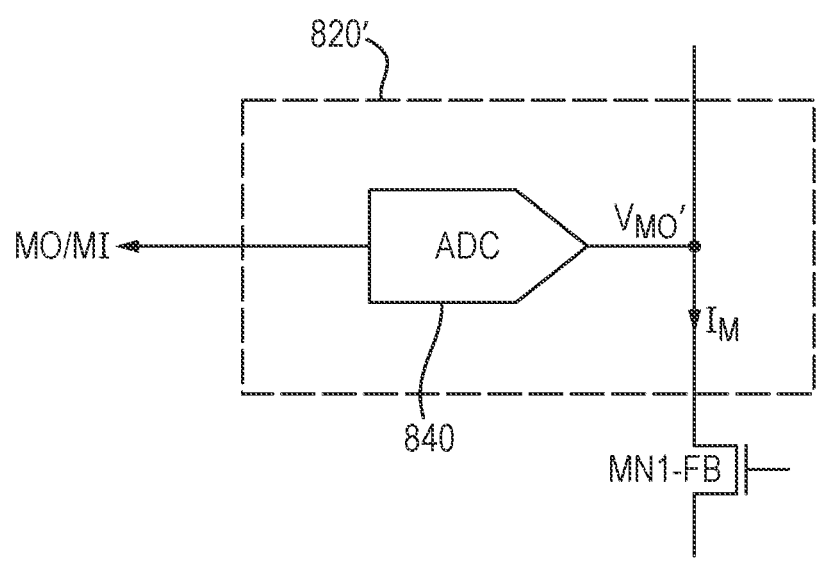
FIG. 9 is a schematic diagram showing another implementation of the generator of FIG. 8.

Merely by way of example, another possible implementation of the generator 820 is shown in FIG. 9 as generator 820' (which could be used in place of the generator 820). Here, a monitoring voltage $V_{MO}'$ developed effectively at the drain terminal of the feedback component (transistor) MN1-FB is directly converted into an equivalent digital signal (monitor signal MO) by the ADC 840.

As above, various elements of the current monitoring unit 430D may be controlled by the control signal CMC provided by the controller 102, and this will now be considered further. As mentioned earlier, the current monitoring unit 430D (and any of the other current monitoring units 430A to 430C) may be controlled e.g. to be 'active' or 'inactive', and/or controlled to control one or more properties of the monitor signal MO, such as a frequency bandwidth, SNR, dynamic range or gain. That is, the current monitoring unit 430D may have 'active' and 'inactive' modes of operation which may be selected and/or controlled.

For example, the current monitoring unit 430D may only need to be 'active' intermittently (e.g. 1% of the time). With this in mind, it may be acceptable for the current monitoring unit 430D to operate when 'active' (in an active mode of operation) with relatively high power (enabling generation of a monitor signal MO with good SNR) without adversely affecting overall power consumption of the overall host device 100. In practice, the current mirror devices MN1 and MN1-M may be scaled relative to one another as mentioned earlier, such that the mirror current $I_M$ is a ratioed version of the speaker (output) current $I_{N1}$.

A further benefit of control of the current monitoring unit 430D may be appreciated by considering an issue which is exacerbated at low signal levels. As indicated in FIG. 8, there is typically an offset voltage $V_{OS}$ between the input terminals of the differential amplifier 810, which becomes increasingly significant (and may even dominate) at low signal levels. However, the offset voltage $V_{OS}$ may manifest itself as a gain error as follows.

Considering output transistor MN1 to have an ON resistance of $R_{MN1}$ and mirror transistor MN1-M to have an ON resistance of $R_{MN1-M}$, it may be said that:

$$I_{N1} \cdot R_{MN1} = I_M \cdot R_{MN1-M} + V_{OS}$$

and thus that $$I_M = \frac{I_{N1} \cdot R_{MN1} - V_{OS}}{R_{MN1-M}}$$

Thus, the gain y of the current mirror may be expressed as:

$$\gamma = \frac{I_M}{I_{N1}} = \frac{I_{N1} \cdot R_{MN1} - V_{OS}}{R_{MN1-M} \cdot I_{N1}} = \frac{I_{N1} \cdot R_{MN1}}{R_{MN1-M} \cdot I_{N1}} - \frac{V_{OS}}{R_{MN1-M} \cdot I_{N1}}$$

which will include an error (a gain error) associated with the offset voltage $V_{OS}$ as in the final term of the above equation. This gain error will increase at small signal error, for any non-zero value of $V_{OS}$.

One approach to deal with this inherent error in the operation of the differential amplifier 810 is to use machine learning (ML) to learn the error. The $R_{MN1}$ and $R_{MN1-M}$ resistances will have Gaussian distributions and an ML-based learner downstream could be trained with the gain errors.

Also, for some sensing applications (unlike speaker protection), it may be the AC aspect of the mirror current $I_M$ which is of interest, rather than the DC term. From the above equations, it can be appreciated that the mirror current $I_M$ may be expressed as:

$$I_M = I_{N1} \cdot \left(\frac{R_{MN1}}{R_{MN1-M}}\right) - \frac{V_{OS}}{R_{MN1-M}}$$

and be considered to be made up of the AC term $$I_{N1} \cdot \left(\frac{R_{MN1}}{R_{MN1-M}}\right)$$

and the DC term $$\frac{V_{OS}}{R_{MN1-M}}$$

A high pass filter could be used to eliminate the DC term, leaving just the signal of interest with a gain term that is a function of the resistances of the mirror devices MN1 and MN1-M and which could be handled by a normalisation function (e.g. normalising between 0 and 1, or 0 and 100) downstream.

Returning to the control of the current monitoring unit 430D by the control signal CMC, attention is drawn to the component control signals C1 to C4 as indicated in FIG. 8.

Depending on the application, the control signal CMC may be considered to comprise any one or more of the component control signals C1 to C4. For example, the current monitoring unit 430D may be used to monitor the speaker current for any of a variety of use cases or applications (which may correspond to respective modes of operation), including ear biometrics, PCG (phonocardiogram) detection and audio capture. Such different use cases may require different performances from the current monitoring unit 430D (including its associated current mirror and ADC).

For example, as a function of use case (mode of operation), different frequency bandwidths, SNR and offset sensitivities may be needed in respect of the mirror current IM. A technique referred to as "chopping" may for example be used to eliminate or reduce the effect of the offset voltage $V_{OS}$. In the so-called chopping technique, the inputs to the differential amplifier 810 may be repeatedly reversed (e.g. at a defined or controlled rate) so that the time-averaged offset voltage falls to zero or is smoothed. Additionally, or alternatively, the ADC performance may also be varied as a function of the use case, for example varying the ADC bandwidth and/or SNR. As an example, a narrow bandwidth (BW) with relatively low SNR may be selected for PCG detection whereas for audio capture both high SNR and high BW may be needed.

The following table is useful to understand how performance requirements may vary with use case or application (mode of operation), with the values given being merely examples:

| Use Case | $I_M$ bandwidth | $I_M$ chopping | $I_M$ SNR | ADC bandwidth | ADC SNR |
| --- | --- | --- | --- | --- | --- |
| PCG | ~500 Hz | Off | Low | 500 Hz | Low |
| Ear Biometrics | ~8 kHz | Off | Medium | 8 kHz | Medium |
| Audio capture | ~16 kHz | On | High | 16 kHz | High |

Other use cases are of course possible, some of which may not approximate to any of the rows in the table.

For example, it may be useful to select a high $I_M$ bandwidth (effectively, the bandwidth of the differential amplifier 810) and a low ADC bandwidth, as an initial detection of an 'event' occurring (without considering the detailed information of the event itself). The 'event' may be, for example, a user transitioning the speaker from an on-ear position to an off-ear position, or vice versa, in the case where the host device 100 is an earphone, earbud or headphone, with that event being represented by a spike or disturbance in the speaker current. Subsequently, the ADC bandwidth could be increased to improve the information content of the monitor signal MO, for example to carry out an ear biometric check.

As another example, it may be useful to include components of the current monitoring unit 430D in an "always on" power domain of the host device 100, with other components of the host device 100 being in a "main" power domain which is kept in a low power state until the host device is woken up by a detected 'wake-up event'. Depending on what the wake-up event is, it may be useful to control the current monitoring unit 430D to be mainly "inactive" and to become "active" only occasionally. It may be useful to control the current monitoring unit 430D to select, for example, low $I_M$ bandwidth and SNR, and also low ADC bandwidth and SNR when awaiting detection of a wake-up event.

For example, the controller 102 (or part thereof) may act as an "always on" controller and may be configured to operate a voice-activity detect algorithm based on analysing or processing the monitor signal MO, and to wake up a "main" controller, which could be a separate applications processor (not shown) or a separate part of the controller 102, when a suitable monitor signal MO is received. As an example, the monitor signal MO may be handled by the "always on" controller initially and routed via that controller to the "main" controller until such time as the "main" controller is able to receive the monitor signal MO directly. In one example use case the host device 100 may be located on a table and it may be desirable to use the speaker 220 as a microphone (as well as any other microphones of the device 100) to detect a voice. It may be desirable to detect a voice when music is playing through the speaker 220.

As another example, the "main" controller once woken up may be configured to operate a biometric algorithm based on analysing or processing the monitor signal MO to detect whether the ear canal of the user (where the speaker 220 is e.g. an earbud as described earlier) corresponds to the ear canal of an "authorised" user. Of course, this may equally be carried out by the "always on" controller. The biometric algorithm may involve comparing the monitor signal MO or components thereof against one or more predefined templates or signatures. Such templates or signatures may be considered "environment" templates or signatures since they represent the environment in which the speaker 220 is or might be used, and indeed the environment concerned need not be an ear canal. For example, the environment could be a room or other space where the speaker 220 may receive incoming sound (which need not be reflected speaker sound), with the controller 402A and/or 402M analysing (evaluating/determining/judging) an environment in which the speaker 220 was or is being operated based on a comparison with such templates or signatures.

Of course, these are just example use cases. Other example use cases will occur to the skilled person based on the present disclosure, with different use cases lending themselves to different configurations of the current monitoring unit 430D.

In relation to any use case or mode of operation, the controller 102 may use the control signal CMC to control current monitoring unit 430D to effect that mode of operation. The controller 102 may use the monitor signal MO as a feedback signal and vary the control signal CMC so that one or more properties of the monitor signal MO tend towards or to equal one or more corresponding target properties or property values.

The signals C1 to C4 (or one or more of them) may be employed to control when the current monitoring unit 430D is 'active' or 'inactive' (in an 'active' or 'inactive' mode of operation). For example, for the 'active' state or mode, the control signals C1 and C2 may be set so that the voltages VN1 and VN1-M are equal (as if the gate terminals of transistors MN1 and MN1-M were connected together). Indeed, those signals could be used to connect the gate terminals of those transistors together. Further, the control signals C3 and C4 may be set so that the differential amplifier 810 and ADC 840 are powered and operational. For the 'inactive' state or mode, however, the control signal C2 may be set so that the transistor MN1-M is OFF (and thus does not pass any current). Further, the control signals C3 and C4 may be set so that the differential amplifier 810 and ADC 840 are disconnected from their power sources, or placed into a low power state. The control signal C3 may also be used to disconnect the output of the differential amplifier 810 from the feedback transistor MN1-FB, or to set the output of the differential amplifier to cause the feedback transistor MN1-FB to be OFF.

The signals C1 to C4 may thus be employed to switch between the 'active' and 'inactive' states/modes as desired, thereby controlling the power consumed by the current monitoring unit 430D (and when the monitor signal MO is available).

As another example, the control signal C3 may be employed to control the output-stage current level (e.g. its bias level) of the differential amplifier 810 to control the frequency bandwidth of the mirror current IM. As another example, the control signal C3 may be employed to control whether the chopping technique is employed in respect of the inputs of the differential amplifier 810 (which related "chopping" circuitry being considered within the differential amplifier 810 in FIG. 8). As another example, the control signal C3 may be employed to control the input-stage current level (e.g. its bias level) of the differential amplifier 810 to control the SNR of the mirror current IM.

As another example, the control signal C4 may be employed to control the clock rate or sample rate of the ADC 840 to control the frequency bandwidth of the monitor signal MO. As another example, the control signal C4 may be employed to control the bias current of the ADC 840 to control the SNR of the monitor signal MO. As another example, the control signal C4 may be employed to control the resolution of the ADC (number of bits, e.g. 4-bit, 8-bit, 10-bit, 12-bit, etc.) to control the resolution of the monitor signal MO. As another example, the control signal C4 may be employed to control the order of the ADC ($1^{st}$ order, $2^{nd}$ order, $3^{rd}$ order etc.).

These are of course just examples. Other control signals (part of the signal CMC) could be employed to introduce or control filtering (not shown) applied to the mirror current $I_M$ and/or the monitor signal MO, to control downstream normalisation and/or filtering (e.g. performed by the controller 102) as mentioned earlier in relation to the current mirror gain error, or to control an adaptive filter that seeks to balance the two gains between different halves of the bridge.

Figure 10:
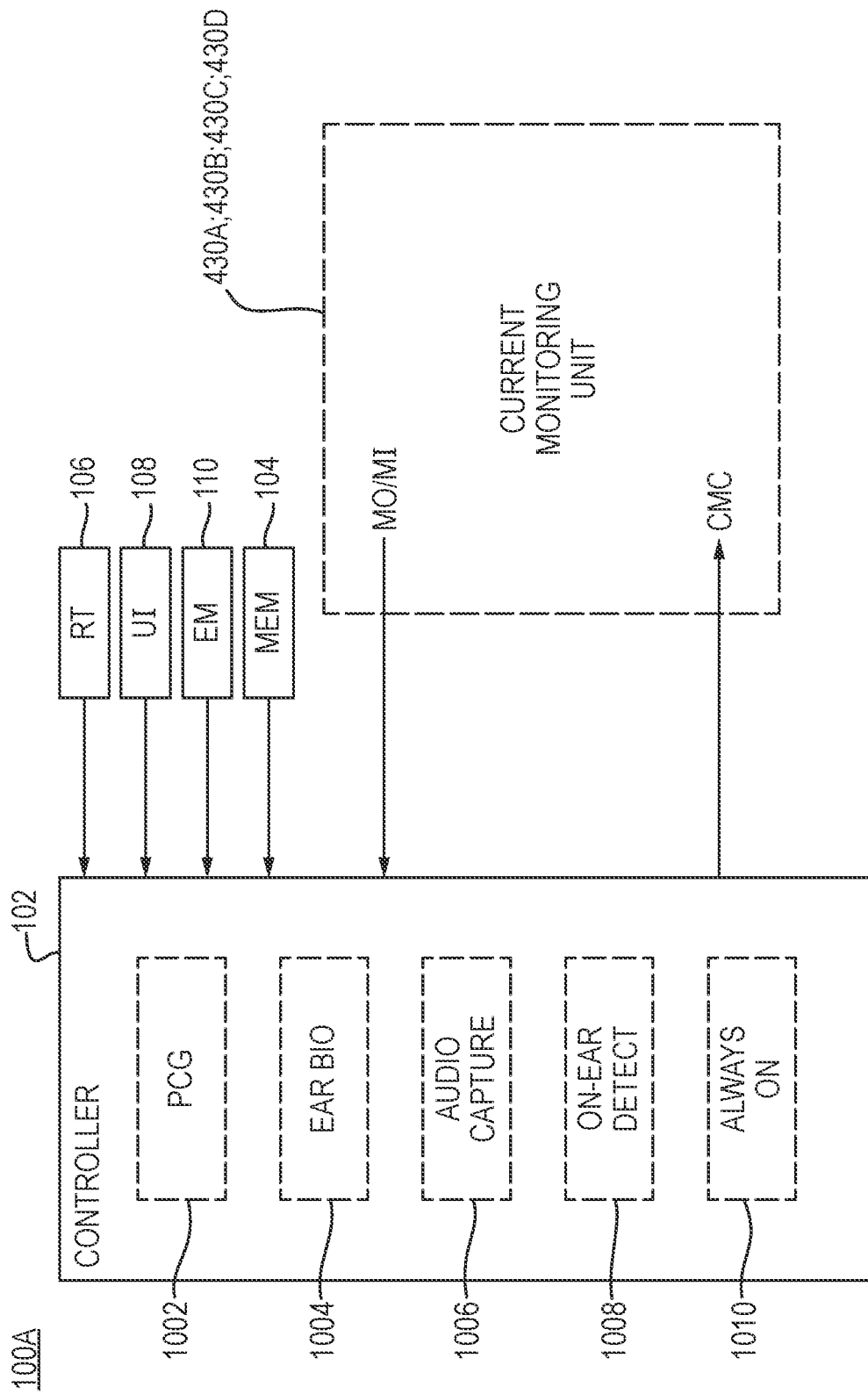
FIG. 10 is a schematic diagram of parts of a host device, being an example implementation of the host device of FIG. 1.

FIG. 10 is a schematic diagram of parts of a host device 100A, being an example implementation of the host device 100. The host device 100A is shown comprising the controller 102, memory (MEM) 104, radio transceiver (RT) 106, user interface (UI) 108, electrostatic microphone (EM) 110, and the current monitoring unit 430D. As indicated, the current monitoring unit 430D could be replaced with any of the current monitoring units 430A, 430B and 430C, and the present disclosure will be understood accordingly.

As before, the controller 102 is shown providing the current-monitoring control signal CMC to the current monitoring unit 430D in order to effect the control discussed above. Similarly, the controller is shown receiving the monitor signal MO from the current monitoring unit 430D. The controller is also shown receiving signals from the memory (MEM) 104, radio transceiver (RT) 106, user interface (UI) 108, and electrostatic microphone (EM) 110.

As above, the controller 102 may be configured to operate in accordance with any of a number of use cases (applications or modes of operation), and a number of possible such use cases as discussed above are schematically shown in FIG. 10 by way of example. These use cases comprise PCG detection 1002, ear biometric testing 1004, audio capture 1006, on-ear detection 1008 and 'always on' monitoring 1010. Of course, these use cases are 'active" use cases and they may also be an 'inactive' use case (not shown).

As such, the controller 102 is configured in the host device 100A to select a use case (or mode of operation) based on any of the received signals (or an internally generated signal), and to output the current-monitoring control signal CMC to control the current monitoring unit 430D accordingly, thereby controlling power performance of the current monitoring unit 430D and/or a property of the monitor signal MO.

Figure 11:
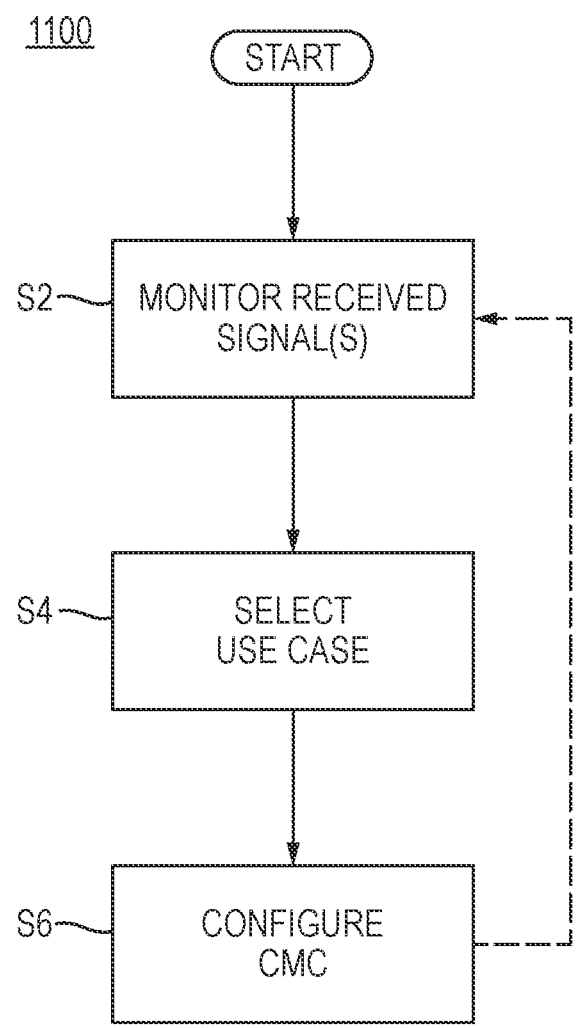
FIG. 11 is a schematic diagram of a method which may be carried out by the controller shown in FIG. 10.

FIG. 11 is a schematic diagram of a method 1100 which may be carried out by the controller 102. The method comprises steps S2, S4 and S6.

In step S2, the controller 102 monitors any received signals (or any internally generated signals). These signals may include any of the signals received by the controller 102 in FIG. 11. In step S2, the controller selects a use case (mode of operation) based on the signal or signals monitored in step S2. The possible use cases (modes of operation) may comprise both 'active' and 'inactive' use cases. In step S6, the controller 102 configures (and outputs) the current-monitoring control signal CMC based on the use case selected in step S4. The current-monitoring control signal CMC in turn controls the current monitoring unit as described earlier.

As indicated, the method may return from step S6 to step S2 (e.g. periodically) so that the selected use case and the configuration of the current-monitoring control signal CMC may change over time, based on the signal or signals received (or internally generated) by the controller 102.

The skilled person will recognise that some aspects of the above described apparatus (circuitry) and methods may be embodied as processor control code, for example on a non-volatile carrier medium such as a disk, CD- or DVD-ROM, programmed memory such as read only memory (Firmware), or on a data carrier such as an optical or electrical signal carrier. For example, the microphone signal generator 240 (and its sub-units 250, 260) may be implemented as a processor operating based on processor control code. As another example, the controller 102 may be implemented as a processor operating based on processor control code. As another example, the current monitoring units may comprise a processor operating based on processor control code to decode the current-monitoring control signal CMC and control elements of the current monitoring units accordingly.

For some applications, such aspects will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware.

Some embodiments of the present invention may be arranged as part of an audio processing circuit, for instance an audio circuit (such as a codec or the like) which may be provided in a host device as discussed above. A circuit or circuitry according to an embodiment of the present invention may be implemented (at least in part) as an integrated circuit (IC), for example on an IC chip. One or more input or output transducers (such as speaker 220) may be connected to the integrated circuit in use.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Monitoring circuitry, comprising:
   a current monitoring unit operable to monitor a speaker current flowing through a speaker and generate a monitor signal indicative of that current; and
   a controller operable, based on a control signal, to control the current monitoring unit to control whether the monitor signal is generated and/or a property of the monitor signal;
   wherein:
      the current monitoring unit comprises a current mirror operable to generate a mirror current which mirrors said speaker current, a magnitude of the mirror current dependent on a magnitude of the speaker current due to current mirroring;
      the monitor signal is, or is generated from, the mirror current; and
      the controller is operable, based on the control signal, to control the current mirror and/or generation of the monitor signal from the mirror current to control whether the monitor signal is generated and/or a property of the monitor signal.

2. The monitoring circuitry as claimed in claim 1, wherein the controller is operable, based on the control signal, to control:
   operation of the current monitoring unit; and/or
   in which mode of operation of a plurality of modes of operation the current monitoring unit operates; and/or
   an operational parameter which defines operation of the current monitoring unit.

3. The monitoring circuitry as claimed in claim 2, wherein said plurality of modes of operation comprises:
   an inactive mode of operation in which the current monitoring unit is inactive and the monitor signal is substantially not generated; and/or
   at least one active mode of operation in which the current monitoring unit is active and the monitor signal is generated.

4. The monitoring circuitry as claimed in claim 1, wherein the controller is operable to generate said control signal based on the monitor signal and/or another signal such as a mode-selection signal.

5. The monitoring circuitry as claimed in claim 1, wherein the controller is operable to determine, analyse or extract information represented by the monitor signal, and to generate said control signal based on that information.

6. The monitoring circuitry as claimed in claim 1, wherein the controller is operable to:
   determine a property of the monitor signal;
   compare the determined property to a target property; and
   generate said control signal to cause the determined property to tend towards the target property.

7. The monitoring circuitry as claimed in claim 1, wherein the property comprises at least one of a frequency bandwidth, an SNR, a dynamic range, a resolution and a gain error.

8. The monitoring circuitry as claimed in claim 1, wherein the controller is configured, based on the control signal, to control the current mirror to control at least one of:
   whether the current mirror is active, such that the mirror current is generated, or inactive, such that the mirror current is substantially not generated or generated as a low-power current in comparison to the mirror current;
   a frequency bandwidth of the mirror current;
   a current-mirror gain error, being an error in the gain between the speaker current and the mirror current, optionally wherein the gain error comprises a DC offset in the gain; and
   an SNR or dynamic range of the mirror current.

9. The monitoring circuitry as claimed in claim 1, wherein the current mirror comprises:
   a first transistor connected to carry the speaker current;
   a second transistor connected to carry the mirror current; and
   a differential amplifier configured to control, based on a feedback potential difference applied between inputs of the differential amplifier being a difference between a first drain-source voltage of the first transistor and a second drain-source voltage of the second transistor, a feedback component connected in series with the second transistor along a current path carrying the mirror current to cause the second drain-source voltage to track and/or substantially tend to equal the first drain-source voltage,
   wherein the controller is configured, based on the control signal, to control:
   whether the monitor signal is generated and/or a property of the monitor signal by controlling the differential amplifier and/or the second transistor; and/or
   at least one of:
   a power supply to the differential amplifier;
   a gate signal of the second transistor;
   a control signal applied to the feedback component;
   whether a polarity of the feedback potential difference applied between the inputs of the differential amplifier is alternated;
   a rate at which the polarity is alternated;
   a bias level of an output-stage current of the differential amplifier; and
   a bias level of an input-stage current of the differential amplifier.

10. The monitoring circuitry as claimed in claim 9, wherein the controller is configured, based on the control signal, to control:
   whether the current mirror is active or inactive by controlling at least one of a power supply to the differential amplifier, a gate signal of the second transistor and a control signal applied to the feedback component; and/or
   the current-mirror gain error by controlling whether a polarity of the feedback potential difference applied between the inputs of the differential amplifier is alternated and/or a rate at which the polarity is alternated; and/or
   the frequency bandwidth of the mirror current by controlling a bias level of an output-stage current of the differential amplifier; and/or the SNR or dynamic range of the mirror current by controlling a bias level of an input-stage current of the differential amplifier.

11. The monitoring circuitry as claimed in claim 1, wherein the current monitoring unit comprises an impedance connected such that said mirror current flows through the impedance, and wherein the monitor signal is generated based on a voltage across the impedance, optionally wherein the impedance is a resistor.

12. The monitoring circuitry as claimed in claim 1, wherein the current monitoring unit comprises a filter operable to filter the mirror current or monitor signal, and wherein the controller is configured, based on the control signal, to configure the filter to control the monitor signal or a signal generated from the monitor signal.

13. The monitoring circuitry as claimed in claim 1, wherein the current monitoring unit comprises a generator operable to generate the monitor signal based on the speaker current or the mirror current, wherein the controller is configured, based on the control signal, to control the generator to control whether the monitor signal is generated and/or a property of the monitor signal.

14. The monitoring circuitry as claimed in claim 13, wherein the controller is configured, based on the control signal, to control the generator to control at least one of: a frequency bandwidth of the monitor signal; an SNR or dynamic range of the monitor signal; and a resolution of the monitor signal.

15. The monitoring circuitry as claimed in claim 13, wherein:
the generator comprises an analogue-to-digital converter configured to generate the monitor signal as a digital signal from the speaker current or the mirror current by analogue-to-digital conversion; and
the controller is configured, based on the control signal, to control:
a clock rate or sample rate of the analogue-to-digital converter; and/or
a bias current of the analogue-to-digital converter;
the resolution of the ADC; and/or
the order of the ADC.

16. The monitoring circuitry as claimed in claim 13, wherein:
the generator comprises an analogue-to-digital converter configured to generate the monitor signal as a digital signal from the speaker current or the mirror current by analogue-to-digital conversion; and
the controller is configured, based on the control signal, to control:
the frequency bandwidth of the monitor signal by controlling a clock rate or sample rate of the analogue-to-digital converter; and/or
the SNR or dynamic range of the monitor signal by controlling a bias current of the analogue-to-digital converter;
the resolution of the monitor signal by controlling the resolution of the ADC; and/or
the order of the ADC.

17. The monitoring circuitry as claimed in claim 1, comprising:
a microphone signal generator operable, when external sound is incident on the speaker, to generate a microphone signal representative of the external sound based on the monitor signal; and/or
a speaker driver operable to drive the speaker based on a speaker signal.

18. A host device, comprising the monitoring circuitry as claimed in claim 1.

* * * * *

UNITED STATES PATENT AND TRADEMARK OFFICE
CERTIFICATE OF CORRECTION

PATENT NO. : 11,317,227 B2  
APPLICATION NO. : 17/038660  
DATED : April 26, 2022  
INVENTOR(S) : John P. Lesso Page 1 of 2

It is certified that error appears in the above-identified patent and that said Letters Patent is hereby corrected as shown below:

In the Specification

In Column 1, Line 60, delete "as" and insert -- is --, therefor.

In Column 5, Line 27, delete "mobile device 102" and insert -- mobile device --, therefor.

In Column 6, Lines 23-24, delete "microelectomechanical" and insert -- microelectromechanical --, therefor.

In Column 7, Line 39, delete "speakers units" and insert -- speaker units --, therefor.

In Column 8, Line 66, delete "and or" and insert -- and/or --, therefor.

In Column 11, Line 56, delete "converter unit 260." and insert -- converter 260. --, therefor.

In Column 13, Line 63, delete "from" and insert -- for --, therefor.

In Column 15, Line 5, delete "(Q)," and insert -- ($\Omega$), --, therefor.

In Column 15, Line 46, delete "RMO." and insert -- $R_{MO}$. --, therefor.

In Column 17, Line 7, delete "RMO" and insert -- $R_{MO}$ --, therefor.

In Column 17, Line 58, delete "either" and insert -- on either --, therefor.

In Column 17, Line 61, delete "either" and insert -- on either --, therefor.

In Column 19, Lines 16-19, delete "Further, the transistors MN1......are the same as one another." and insert the same on Column 19 Line 15 after "current path.", as a continuation paragraph.

Signed and Sealed this  
Fifth Day of September, 2023

Katherine Kelly Vidal  
*Director of the United States Patent and Trademark Office*

CERTIFICATE OF CORRECTION (continued)
U.S. Pat. No. 11,317,227 B2

In Column 19, Line 65, delete "$I_N.$" and insert -- $I_{N1}.$ --, therefor.

In Column 20, Line 26, delete "$I_S \times R_{MO}$" and insert -- $I_M \times R_{MO}$ --, therefor.

In Column 21, Line 27, delete "y" and insert -- $\gamma$ --, therefor.

In Column 22, Line 24, delete "IM." and insert -- $I_M.$ --, therefor.

In Column 23, Line 11, delete "voice-activity detect algorithm" and insert -- voice-activity detection algorithm --, therefor.

In Column 24, Line 20, delete "IM." and insert -- $I_M.$ --, therefor.

In Column 24, Line 23, delete "related" and insert -- is related to --, therefor.

In Column 24, Line 28, delete "IM." and insert -- $I_M.$ --, therefor.

In Column 24, Lines 46-47, delete "current mirror gain error," and insert -- current-mirror gain error, --, therefor.

In Column 25, Line 6, delete "'active'" and insert -- "active" --, therefor.